United States Patent
Kiani et al.

[19]

[11] Patent Number: 6,137,064

[45] Date of Patent: Oct. 24, 2000

[54] SPLIT VIA SURFACE MOUNT CONNECTOR AND RELATED TECHNIQUES

[75] Inventors: Sepehr Kiani, Watertown, Mass.; R. Ryan Vallance, Lexington, Ky.

[73] Assignee: Teradyne, Inc., Boston, Mass.

[21] Appl. No.: 09/359,849

[22] Filed: Jul. 23, 1999

Related U.S. Application Data

[60] Provisional application No. 60/138,730, Jun. 11, 1999, and provisional application No. 60/139,063, Jun. 11, 1999.

[51] Int. Cl.$^7$ ............................. H01R 12/04; H05K 1/11
[52] U.S. Cl. ......................... 174/266; 174/261; 174/262; 361/794
[58] Field of Search .................................. 174/262, 266, 174/261, 263; 361/803, 794, 792, 795; 257/774

[56] References Cited

U.S. PATENT DOCUMENTS

| | | |
|---|---|---|
| 3,739,469 | 6/1973 | Dougherty, Jr. ............................ 29/625 |
| 4,498,812 | 2/1985 | Rainal ...................................... 361/414 |
| 4,543,715 | 10/1985 | Iadarola et al. ............................ 29/852 |
| 5,381,306 | 1/1995 | Schumacher et al. ................... 361/792 |
| 5,623,160 | 4/1997 | Liberkowski ............................ 257/261 |
| 5,825,084 | 10/1998 | Lau et al. ................................ 257/700 |

FOREIGN PATENT DOCUMENTS

| | | |
|---|---|---|
| 3422094 A1 | 1/1985 | Germany . |
| 6326462 | 11/1994 | Japan ................................ H05K 3/42 |
| 7193343 | 7/1995 | Japan ................................ H05K 1/02 |

OTHER PUBLICATIONS

"Making Interconnections in Multilayer Boards", F.M. Reinhart, IBM Technical Disclosure Bulletin, vol. 10, No. 12, May 1968, pp. 1985–1986.

"The Concept of an Applications for Bifurcated Plated–Thru–Holes for Printed Circuit Boards", Robert Barnhouse, Northern Telecom Electronics, 1601 Hill Ave., West Palm Bch., Fl 33407, pp. 349–355. (Date & Source Unknown).

Revolutionary Backplane Technology for Filtering and Bypassing the Supply Voltage Part 1, Theoretical Considerations, Andrea Lenkisch, Trenew Electronic GmbH, Storchenweg 1, 75180 Pforzheim, 5 pages. (Date & Source Unknown).

Revolutionary Backplane Technology for Filtering and Bypassing the Supply Voltage Part 2, Realisation and Results, Andrea Lenkisch, Trenew Electronic GmbH, Storchenweg 1, 75180 Pforzheim, 4 pages. (Date & Source Unknown).

*Primary Examiner*—Jeffrey Gaffin
*Assistant Examiner*—Jeremy Norris
*Attorney, Agent, or Firm*—Daly, Crowley, & Mofford, LLP

[57] ABSTRACT

An interconnection circuit includes a plated through hole having a plurality of electrically isolated segments with at least one of the plurality of electrically isolated segments coupled to a signal path and at least one of the electrically isolated segments coupled to ground. With this arrangement, the circuit provides a signal path between a first and a second different layers of a multilayer. By providing one segment as a signal segment and another segment as a ground segment the size and shape of the electrically isolated segments can be selected to provide the interconnection circuit having a predetermined impedance characteristic. The interconnection circuit can thus be impedance matched to circuit board circuits, devices and transmission lines, such as striplines, microstrips and co-planar waveguides. This results in an interconnection circuit which maintains the integrity of relatively high-frequency signals propagating through the interconnection circuit from the first layer to the second layer. The interconnect circuits can be formed by creating distinct conductor paths within the cylindrical plated through-holes using variety of manufacturing techniques including, but not limited to, broaching techniques, electrical discharge milling (EDM) techniques and laser etching techniques.

23 Claims, 26 Drawing Sheets

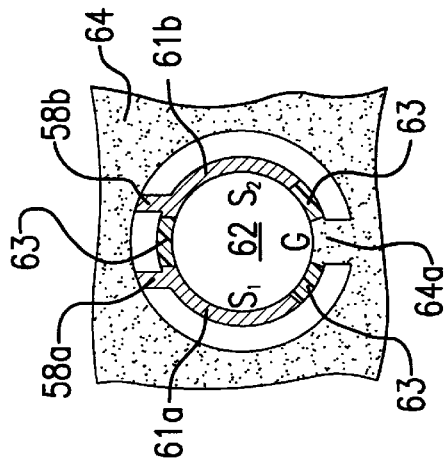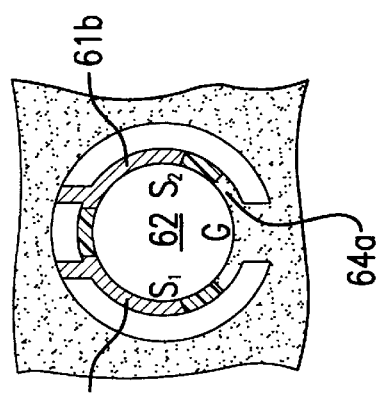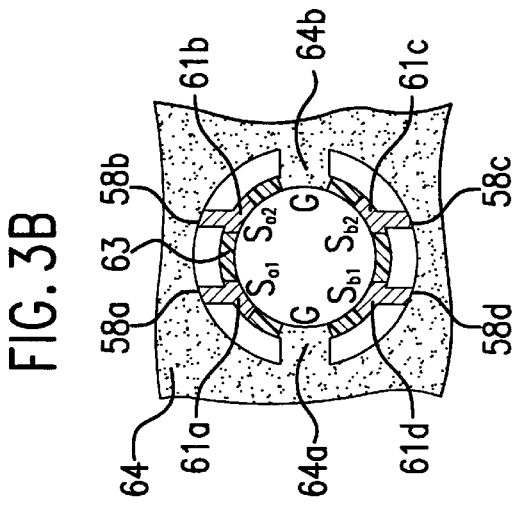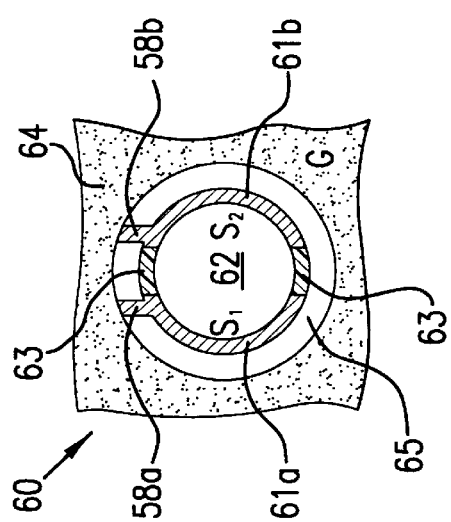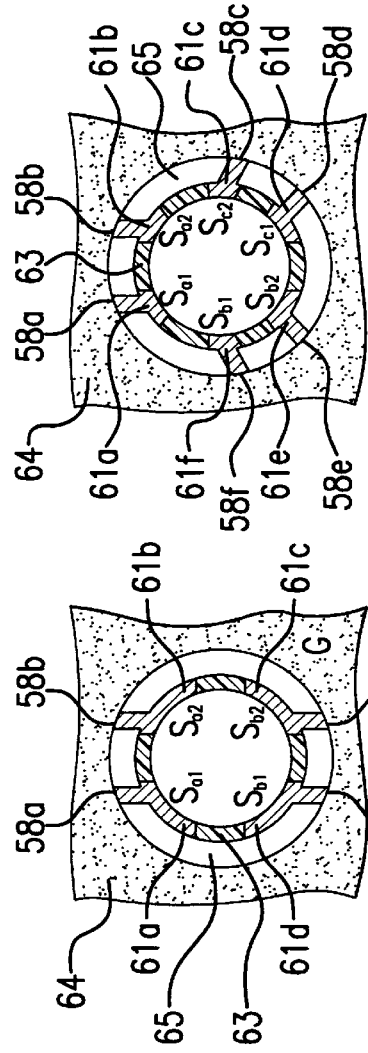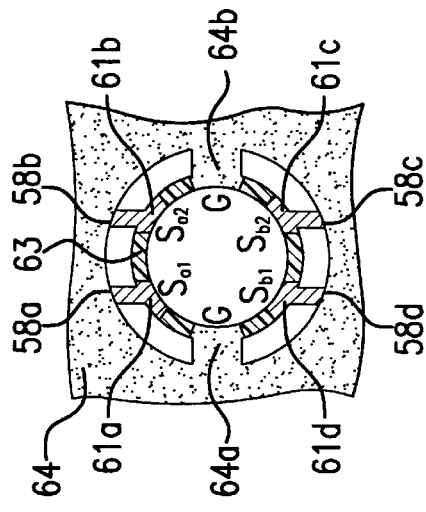

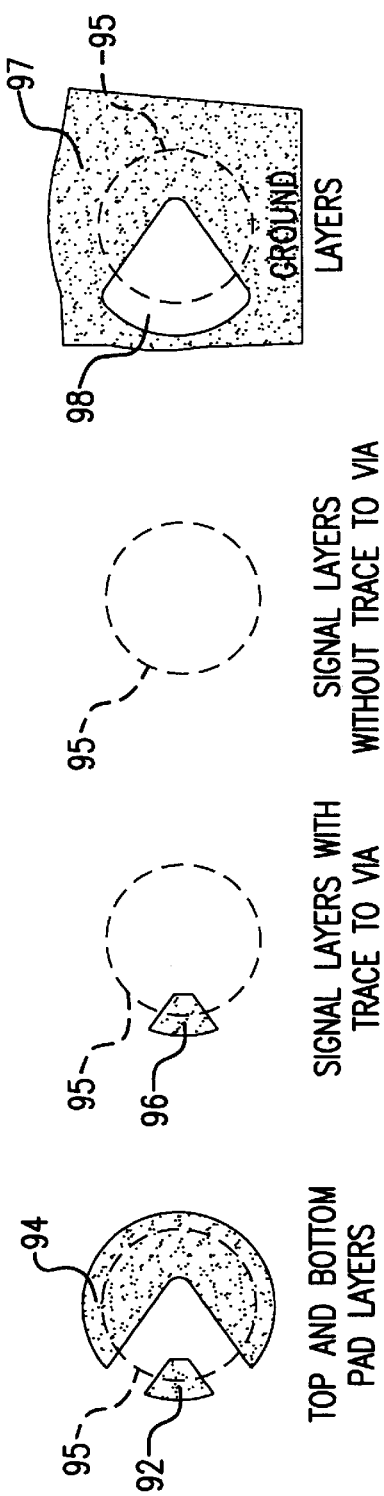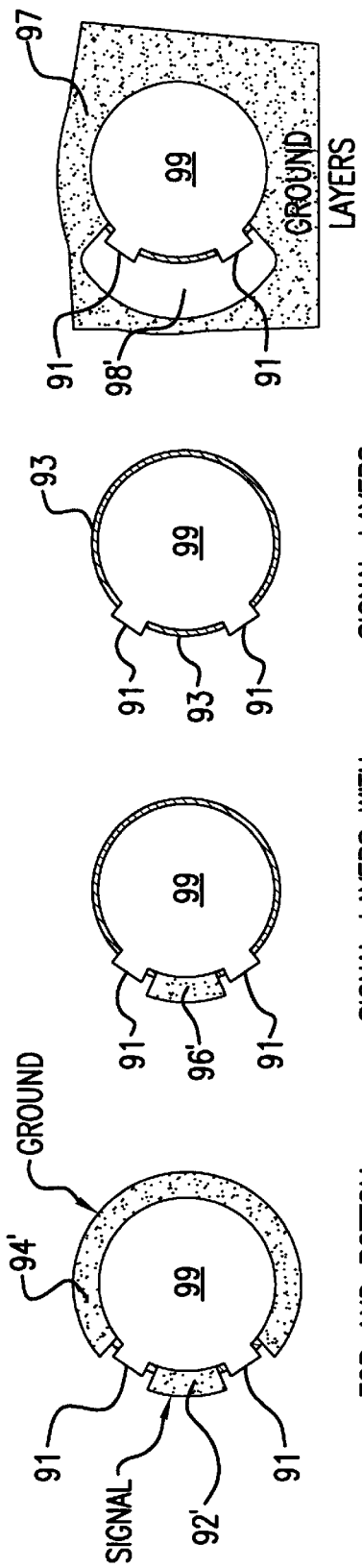

SPLIT VIA SURFACE MOUNT CONNECTOR AND RELATED TECHNIQUES

RELATED APPLICATIONS

This application claims priority under 35 U.S.C. §119(e) from Application Nos. 60/138,730 and 60/139,063 each filed Jun. 11, 1999 and application Ser. No. 09/360,002, filed Jul. 12, 1999 entitled Multi-Connection Via and Related Circuits and Techniques having named inventor Sepehr Kiani all of which are hereby incorporated herein by reference in their entirety.

GOVERNMENT RIGHTS

Not applicable.

FIELD OF THE INVENTION

This invention relates generally to electrical connections between layers of multi-layer printed circuit boards and more particularly to a class of layer-to-layer interconnections referred to as via circuits or more simply vias.

BACKGROUND OF THE INVENTION

As is known in the art, there exists a class of electrical connection structures, referred to as plated through holes (PTHs) or via circuits or more simply vias, which provide layer-to-layer interconnections in multi-layer printed circuit boards (PCBs).

A conventional via in a multi-layer PCB is typically provided by drilling or otherwise forming a hole through the PCB. The through hole passes through all conductive layer traces in the PCB which are intended to be connected. The hole is then plated to form an electrical connection among the conductive traces. In this manner, electrical connections between layers of multi-layer PCBs can be provided. This process can be used to provide a signal path through which a single signal propagates between layers of a PCB. Connections to conductive traces or signal paths in each of the PCB layers can be made. This via connection technique conserves space on the PCB and thus allows PCBs to be more densely populated.

The via has been the mainstay of layer-to-layer interconnection since the inception of double-sided and multi-layer boards. Originally vias served dual purposes, providing layer-to-layer interconnect and through-hole component mount. The growth of surface mount component technology (with the exception of backplane connectors and other large devices), however, has reduced the need to utilize vias for through-hole component mount and has resulted in the via primarily providing layer-to-layer interconnection.

There has, however, been a trend to provide PCBs having increasingly higher circuit density and higher circuit speed. To help meet the demand for increased circuit density, it has been proposed to provide more than one independent signal path or connection in a single via. To provide multiple connections in the same via of a PCB, the via is formed as described above. Discrete connections are then formed among the conductive traces of the PCB by establishing grooves in the plating of the via to electrically isolate segments of the PCB. This technique permits two or more independent connections to be made in the same via of a multi-layer PCB. This technique further conserves space on the PCB and thus allows PCBs to be even more densely populated.

Despite the advances made in increasing circuit density on PCBs, the high performance requirements of modern integrated circuit (IC) devices impose requirements for increasingly higher density of interconnections on PCBs so that the PCBs can accept the large number of input and output signal lines from IC devices which are packaged into increasingly smaller volumes. All of these design and performance considerations add to the difficulties in attempting to lower PCB production costs which are increasing due to the use of complicated multiple-layer substrates.

Furthermore, modern IC devices operates at increasingly higher frequencies. As clock frequencies of circuits used on PCBs exceed 100 MHz, the electrical characteristics of PCB traces resemble high-speed signal transmission lines rather than D.C. electrical circuits. The higher clock frequencies and resultant shorter signal rise times expose PCB performance limitations which are manifested by signal integrity phenomena such as ringing, reflections, ground bounce, and crosstalk.

State of the art computer motherboards operate at frequencies of 100 MHz and above, while telecommunications and high performance systems use device to board frequencies an order of magnitude higher. High performance systems having chip-to-board clock speeds in the GHz range are expected. To support these current and future performance demands, improvement gains in PCB technology are required.

To address the above density and speed concerns "buildup technologies" such as photo-via redistribution, and sheet buildup, have been developed. These techniques have increased PCB performance significantly. These techniques, however, rely on thinner layers and use chemical etching (photo-defined vias), laser ablation, or plasma etching technologies to drill holes and connect PC board layers. Thus, such techniques are not appropriate for use in PCBs which include a relatively large number of layers between signal paths which must be connected.

So-called micro-vias have also been proposed. Both the signal and density performance of micro-vias are very good in comparison to drilled vias. There are still discontinuities in the signal path, because the ground plane is disrupted. However, because the scale is so small, this problem is minimal, especially when only going through one layer (which does not break the continuous ground path). Micro-vias are particularly useful in applications in which the number of PCB layers is relatively small or where density is extreme, such as in micro ball grid array ($\mu$BGA) escapement. As an added benefit, micro-vias can be placed directly in a surface mount pad.

Because micro-vias must be manufactured from the outer surface (often out of non-woven aramid reinforced layers or unreinforced dielectric), the micro-vias can only be on the outer traces unless subsequent layers are built on top of the constructed panel. Each layer adds significant processing cost. Via depth is limited greatly because the plating chemistry cannot flow through small blind holes in the same manner as through-hole vias. Similar limitations exist for laser ablated and co-deposition vias. Thus, micro-vias are also not particularly useful in PCBs which include a relatively large number of layers between signal paths which must be connected.

Furthermore, none of the above techniques address the problem of maintaining signal strength and quality (i.e. shape of signal, lack of noise from either internal reflections or cross talk from other lines) collectively referred to herein as signal integrity as device operating frequencies increase and/or clock rise times decrease. Moreover, owing to the addition of noise as well as reflections due to impedance mismatches, signal quality suffers when the impedance of the layer-to-layer interconnection transmission structure changes, resulting in parasitic wave reflections and in some cases resonation. This results in a signal path having a relatively high insertion loss characteristic. A secondary related effect is crosstalk, which relates to the electromagnetic interference (EMI) between circuit structures. Thus, one problem with the prior art approaches, is that they merely attempt to increase density on a printed circuit board and they fail to provide any mechanisms for maintaining signal integrity and signal quality.

It would, therefore, be desirable to provide an interconnection structure which provides a layer-to-layer signal path which is relatively low loss, which does not degrade signal performance, which maintains signal integrity and which allows increased density of connections. It would also be desirable to provide an interconnection structure which is easily adapted to work with existing PCB manufacturing techniques, components and the like.

It would further be desirable to provide an interconnection structure which reduces the number and magnitude of impedance discontinuities due to transmission structure changes and which reduces the amount of crosstalk between circuit structures.

SUMMARY OF THE INVENTION

It has, in accordance with the present invention, been recognized that although signal lines within a single printed circuit board (PCB) layer are provided having predetermined impedance characteristics (i.e. the impedance of the signal line is controlled), such impedance control is not available for conventional plated-through holes (PTHs) which are used to provide signal paths between different layers of the PCB. This lack of control of the impedance characteristics of the via results in relatively large impedance mismatches between the via and other circuits/circuitry. Thus, the vias have relatively high insertion loss characteristics due primarily to impedance mismatch.

Because the via are lossy, there has been a desire and need to minimize number of vias on PCBs. In an effort to minimize the number of vias, circuit traces are ideally limited to a single plane (i.e. a single layer) in the PCB. Limiting the circuit traces to a single plane, however also limits the number of possible circuit layout which are available to a circuit board designer.

In accordance with the present invention, an interconnection structure for providing a signal path between a first layer and a second different layer of a multi-layer structure includes a via having a plurality of electrically isolated segments with at least one of the electrically isolated segments coupled to a signal path and at least one of the electrically isolated segments coupled to ground. With this particular arrangement, a multi-connection via (MCV) which does not degrade signal performance, signal integrity or signal quality of relatively high frequency signals is provided. By coupling a first segment of the via to a signal path and having a second segment of the via in proximity to the first segment coupled to ground, a defined electric field pattern is established in the via when signals having a relatively high frequency propagate through the via. By providing a structure through which a signal can propagate with a defined electric field pattern, the MCV provides a signal path having a relatively low insertion loss characteristic to relatively high frequency signals propagating therethrough. The impedance characteristic of the via can be selected by appropriately selecting a variety of via characteristics including but not limited to the hole diameter of the via and the relative widths of the signal and ground segments.

This allows manufacture of printed circuit boards (PCBs) which include vias having a relatively low insertion loss characteristic and a relatively low return loss characteristic. The vias provide signal paths having a relatively low insertion loss characteristic because the vias can be designed and manufactured having defined impedance characteristics. The via can thus be designed to better match (in an impedance matching sense) the IC devices or circuits or signal paths coupled thereto. Because the via of the present invention provides a relatively low loss, reliable signal path between layers of a multi-layer printed circuit board, it is not necessary to restrict the PCB circuit layouts to a single layer or plane. Consequently reducing the number of required layers in a PCB.

Furthermore the MCV of the present invention can be provided having multiple signal segments and/or multiple ground segments to thus allow inclusion of more signal traces in a single via. This allows the manufacture of PCBs having relatively high circuit density. The MCV of the present invention allows impedance control of signal paths between layers of a multi-layer PCB and thereby allows use of a connector which integrates tightly with the PCB. This type of impedance control is not possible with conventional via technologies, including advanced structures such as micro vias. Thus the MCV of the present invention. This ability fundamentally changes routing rules for high speed signal traces, allowing for layer changes without concern of signal degradation. Furthermore, signal performance of the co-cylindrical wave-guide structure is completely independent of diameter. Moreover, MCVs having multiple signal and ground segments which provide improved electrical performance allow further increases in connection density.

The MCV may be considered as a "shielded via" which offers improved performance to connectors and devices without requiring design changes of the PCB, connectors or devices. That is, the MCV of the present invention is compatible with conventional PCB manufacturing processes including PCB via manufacturing processes.

To construct multi-connection vias in PCBs for signal experiments, a broach process can be used to segment plated-through holes to provide isolated segments. Alternatively, MCVs can be provided using an electrical discharge machining (EDM) process. In utilizing the EDM process it should be noted that to properly utilize an EDM process to manufacture the multi-connection vias, it is necessary to provide a signal path from each of the individual segments of the via to ground during the EDM process.

In accordance with a still further aspect of the present invention a method of routing signal traces in multi-layer printed circuit board using a multi-connection via (MCV) includes the steps of providing a multi-connection via having at least a pair of signal segments and at least one ground segment, connecting a first signal trace to a first one of the pair of signal segments, connecting a second signal trace to a second different one of the pair of signal segments and connecting the ground segment to a groundplane layer of the multi-layer printed circuit board. With this arrangement, a technique for reducing the number of vias provided in a multi-layer printed circuit board to route signal traces between different layers of the multi-layer printed circuit board is provided. This routing technique utilizing MCVs finds particular applicability when routing high speed signal traces in PCBs and maintaining signal integrity is an important concern.

In accordance with a still further aspect of the present invention, a multi-connection via launch includes a connector having a signal contact and ground contact disposed in an MCV. The MCV includes a ground via segment coupled to a ground plane and the ground contact of the connector and a signal via segment coupled to a signal trace and the signal contact of the connector. Since the impedance characteristics of the MCV can be controlled, the MCV can act as an impedance matching structure between the connector and the signal trace on the PCB. This arrangement solves the problem of device and connector launch to the PCB which represents a major discontinuity in a signal path. The performance benefits provided by the MCV's impedance-controlled structure throughout the transition thus carry over to PCB connector and device launches.

BRIEF DESCRIPTION OF THE DRAWINGS

The foregoing features of the invention, as well as the invention itself may be more fully understood from the following detailed description of the drawings, in which:

FIGS. 3–3E are a series of top views illustrating different examples of differential via structures;

FIGS. 7–7C are a series of views illustrating a pad stack prior to drilling and plating steps;

FIGS. 8–8C are a series of views illustrating a pad stack after drilling and plating steps;

FIGS. 18 and 18A are a series of perspective views which show a surface mount device disposed over and on, respectively, a multi-connection via;

FIGS. 19 and 19A are a series of perspective views which show a surface mount device having an eye of the needle connector disposed over and on, respectively, a multi-connection via;

DESCRIPTION OF THE PREFERRED EMBODIMENTS

Before proceeding with a description of the figures, it should be noted that reference is sometimes made herein to multi-connection vias (MCVs) manufactured in a printed circuit board or multi-layer structure made from a particular material such as FR4. Those of ordinary skill in the art should appreciate that other materials suitable for manufacture of printed circuit boards and multi-layer structures may also be used. Reference is also sometimes made herein to MCVs having a particular cross sectional diameter. It should be understood that MCVs having any diameter may be used. Also, MCVs having a substantially round cross-sectional shape are herein described. It should be appreciated that MCVs having other shapes including but not limited to oval, rectangular, square, triangular and irregularly shapes may also be used.

Figure 1:
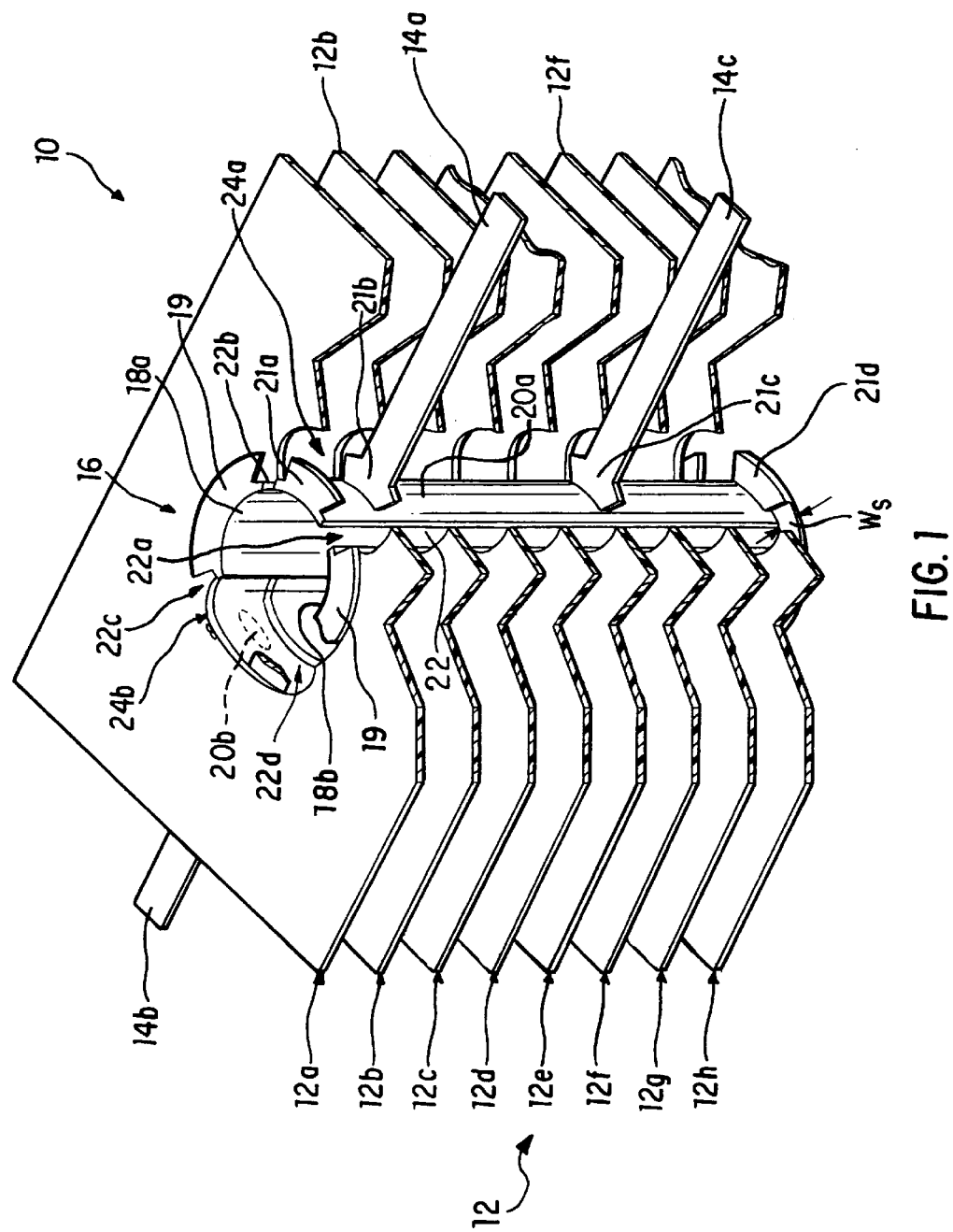
FIG. 1 is a perspective diagrammatical view of a multi-connection via.

Referring now to FIG. 1, a multi-layer printed circuit board (PCB) 10 (also sometimes referred to herein as a multi-layer structure 10) includes a plurality of layers 12a–12h, generally denoted 12 each of which corresponds to a ground plane layer. Each of the ground plane layers 12 may be provided from a conductive material (e.g. a sheet of copper foil) which is typically supported by a support structure such as a dielectric core material, for example. The ground plane layers 12 may be disposed, deposited, attached or otherwise provided on the support structures using any well-known technique. PCB 10 also includes a plurality of signal traces 14a–14c, generally denoted 14 which are disposed on different signal layers of the PCB 10. It should be noted that in FIG. 1, to promote clarity in the figure, the dielectric cores or other structures which support each of the ground plane layers 12 and the signal traces 14 are not shown. By way of terminology, the layers of PCB 10 on which signal traces (such as signal traces 14a–14c) are disposed are referred to as signal trace layers or more simply signal layers. Similarly, the layers of PCB 10 on which are disposed ground planes (such as ground planes 12) are sometimes referred to as ground planes or more simply ground layers. Similarly again, the layers of PCB 10 on which power signals are disposed are sometimes referred to as power layers or power planes.

Although the signal traces 14a, 14c are disposed on different layers of the multi-layer structure 10, they are electrically coupled through an interconnection device 16. Interconnection device 16 is a multi-connection via (MCV) 16 which can provide multiple signal paths between any of the signal traces 14 on any signal layer of the multi-layer structure 10. MCV 16 is provided from conductive material disposed on the walls of an opening in the multi-layer structure. The conductive material is disposed to form a plurality of separate segments 18a, 18b, 20a, 20b which are electrically isolated from each other. Although MCV 16 is here shown having four electrically isolated segments 18a, 18b, 20a, 20b, it should be appreciated that MCV 16 can be provided having fewer or greater than four segments. The particular number of segments to be provided in an MCV depends upon a variety of factors including, but not limited to, the particular application, the number of signal traces to be connected and the limits on mechanical tolerances and printed circuit board processes imposed by manufacturing techniques.

In one embodiment, the opening in the multi-layered structure 10 is provided as a conventional plated through hole (PTH) which is then "split" to provide the electrically isolated segments. It should be noted that portions of the layers 12 and interconnection device 16 have here been removed to promote clarity in the figure. Thus, a portion of segment 20b is shown in phantom and in this particular embodiment, segment 20b has a size, shape and function similar to segment 20a. Segments 18a, 18b have pad regions 19 (or more simply pads 19) while segments 20a, 20b have pads 21a–21d generally denoted 21. The purpose of the pads 19, 21 will de described below.

In this particular embodiment, segments 18a, 18b, 20a, 20b are electrically isolated from each other by providing spaces or splits generally denoted 22 between each of the segment 18a, 18b, 20a, 20b, in the MCV 16. In this example, split 22a is between segments 18b and 20a, split 22b is between segments 20a and 18a, split 22c (only partially visible in FIG. 1) is between segments 18a and 20b and split 22d (not visible in FIG. 1) is between segments 20b and 18b. It should be noted that a variety of different manufacturing techniques can be used to electrically isolate the segments 18a, 18b, 20a, 20b. Thus, the term "split" should not be misconstrued to imply that the only technique to provide the electrically isolated segments 18a, 18b, 20a, 20b is mechanical cutting or splitting of the conductive material which forms the walls of the hole in the multi-layer structure 10.

It should also be noted that a variety of different techniques for manufacturing the isolated segments 18a, 18b, 20a, 20b, including, but not limited to, abrasive waterjet cutting, broaching, laser machining, milling, EDM, ultrasonic machining, selective patterning or deposition, selective plating and chemical etching processes can be used. Also, so-called non plating processes involving the use of conductive inks applied by either printing or screening processes can also be used.

It should further be noted that the operation and advantages of the MCV 16 as well as other MCV structures described herein are independent of the particular manufacturing techniques used to provide the MCVs. Any manufacturing technique including but not limited to those mentioned above, which can reliably be used to manufacture high quality, reliable MCVs and PCBs may be used. The particular manufacturing technique which is used in any application will depend on a variety of factors including but not limited to the purpose of the particular application (e.g. space, military, commercial), the cost of the manufacturing process (including development costs as well as the costs of start-up tooling or machinery) compatibility with standard PCB manufacturing processes, the quality with which the MCVs and PCBs can be manufactured compared with the quality of the MCVs and PCBs required for the application, production rate required for a particular application, circuit geometry generation capabilities vs. circuit geometry required in any particular application and control and scale of feature parameters of the MCV and PCB.

Since the segments 18a, 18b, 20a, 20b are electrically isolated, the segments may be independently coupled to different circuit structures or components (e.g. signal or ground paths, IC devices, etc . . . ) of the multilayer structure 10. As shown in FIG. 1, segments 18a, 18b are each coupled to ground plane 12a via pads 19. Thus, segments 18a, 18b are effectively coupled through the ground plane 12a on PCB 12a. Similarly, segments 20a, 20b are coupled to respective ones of the signal paths 14a, 14b through pads 21b, 21c.

Pad 21a is disposed on a top layer dielectric layer of PCB 10 and pad 21d is disposed on a bottom dielectric layer of the PCB 10. Pads 21a, 21d are not coupled to signal traces. It should be noted that in some applications it may be desirable to provide pads 21a, 21d having a size and shape which is different that the size and shape of pads 21b, 21c. As will be described further below in conjunction with FIG. 1C and FIGS. 7–8C, the widths $W_s$ of pads 21a–21d are selected to both accommodate mechanical tolerances in the manufacture of MCVs and to help provide a good impedance match to the respective signal path or circuit component coupled thereto.

It should be appreciated that portions 24a, 24b of each of the ground plane layers 12 of PCB 10 are removed over the regions where the signal segments 20a, 20b of the MCV exist to help reduce impedance discontinuities and control impedance values in the signal segments 20a, 20b.

As mentioned above, signal paths 14a and 14c are on layers of different ones of the PCBs 12. Each of the signal traces 14a, 14c have a first end coupled to respective ones of pads 21b, 21c which in turn are coupled to signal segment 20a. Thus, signal segment 20a provides an electrically conductive signal path between signal traces 14a and 14c.

The impedance characteristics of segment 20a presented to signal paths 14a, 14b can be controlled by selection of the dimensions of the MCV structure 16. In particular, by selecting the relative shapes and dimensions of the signal segments and ground segments as well as the shapes and dimensions in the openings in the ground plane layers (e.g. portions 24a, 24b) the MCV can be provided having signal path performance characteristics required for supporting the signal bandwidth of current and future devices used in multi-layer structures such as multi-layer structure 10. As is known, there is a trend to use devices which operate at increasingly high clock frequencies. As high frequency signals propagate along signal traces of PCBs, the integrity of the signals as they traverse between different layers of a multi-layer structure must be preserved. The impedance-controlled MCV structures 16 of the present invention provide appropriate vehicles for such transmission.

If a signal path is perfectly impedance matched, the signal will experience no impedance transitions which provide points of energy loss. The only losses in a perfectly impedance matched signal path are those from the dielectric (i.e. attenuation), which are length-of-trace dependent. Attenuation is a significant problem in relatively large PCBs, such as backplanes, where the trace lengths of the signal paths are long compared to the wavelength of the signal. When there are impedance discontinuities in the signal path, additional energy is lost and the signal propagating along the path is weakened. This lost energy has several effects on the circuit.

First, part of the signal is reflected back towards the source. This reflection can manifest itself as noise on the signal path. If two impedance mismatches are spaced by a distance approximately an integer multiple of a quarter-wavelength of the signal frequency, the reflections will resonate between the impedance mismatches. A common case is that of short unterminated lines (also sometimes referred to as stubs), where the signal propagates to the end of a signal trace that is terminated in either an open or a short circuit (i.e. the end of the signal trace is not connected to any structure intended to provide an impedance matching function) thereby causing all of the signal energy to be reflected.

Second, if the signal path is not fully controlled (e.g., completely bound by ground structures) within the range of other signal carrying lines, electromagnetic interference (EMI) will result. EMI reduces the energy of the signal, and these free energy waves cause or induce crosstalk to other circuits. Crosstalk refers to the inducement or coupling of a signal from one signal trace or line to another signal trace or line. A crosstalk signal is a signal which is induced on one signal line from the electromagnetic field surrounding a signal line on which a signal is propagating. A crosstalk signal can occur from between a board and a device above the board and manifest itself as noise on signal lines physically proximate to the signal line on which a signal was originally propagating. Devices typically have maximum noise levels which they will safely tolerate before erratic behavior occurs and crosstalk can be a significant source of noise. Crosstalk can thus be a source of device and PCB malfunction. The impedance controlled MCV structures of the present invention can, therefore, help reduce this problem.

Figure 1A:
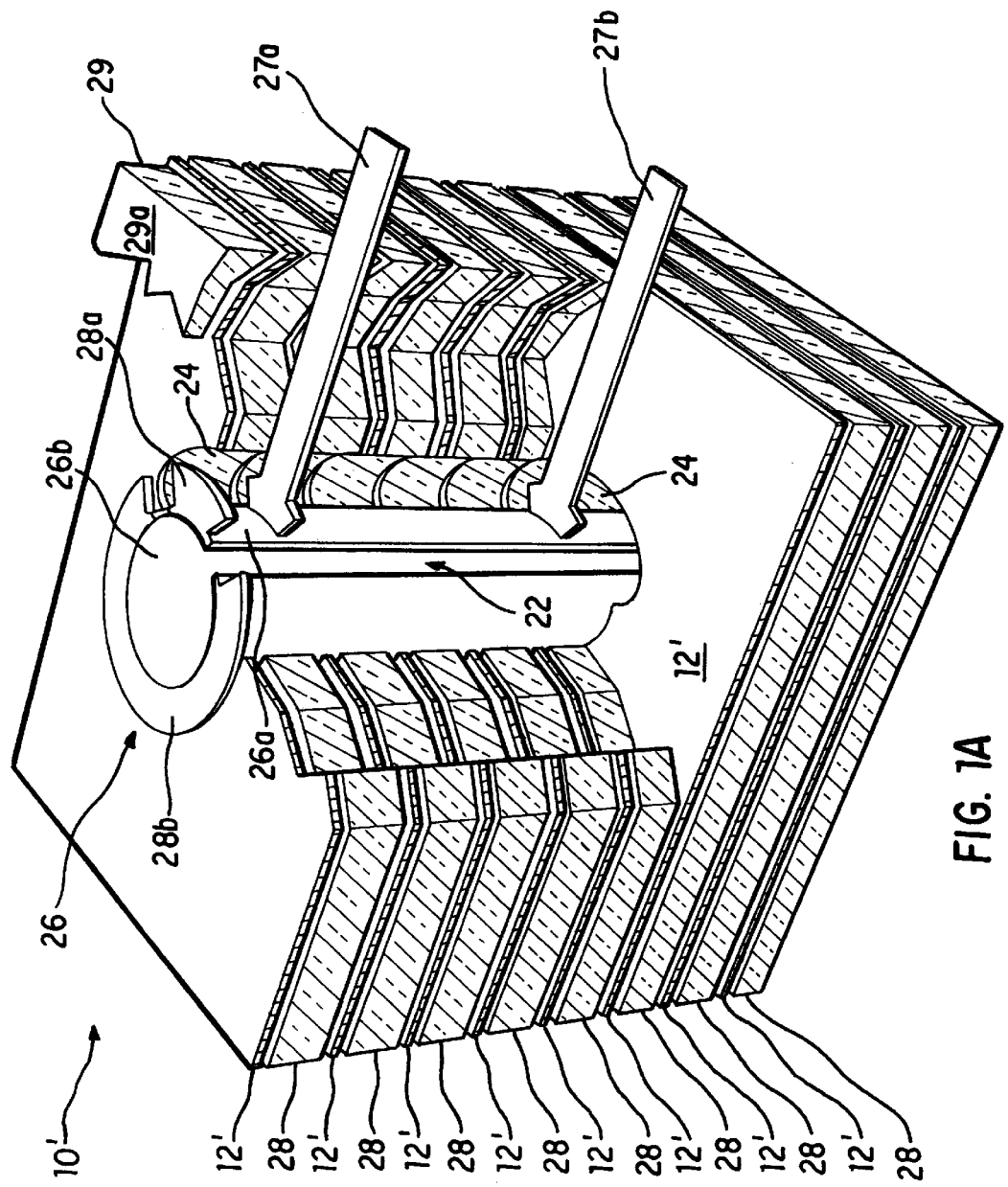
FIG. 1A is a perspective diagrammatical view of a multi-connection via.

Referring now to FIG. 1A a multi-layer structure 10' having a plurality of layers 12' has provided therein an MCV 26 which includes a signal segment 26a and a ground segment 26b coupled to pads 27. In FIG. 1A, a plurality of dielectric cores 28 which act as the support structures for ground plane layers 12' and signal traces 14' are shown. It should be noted that dielectric support structure 29 is disposed above the pad 28b and below the pad 28a (i.e. the pad 28a lies on a top surface 29a of the support structure 29 while a bottom surface of the support structure 29 lies on the top surface of the pad 28b). The MCV 26 can be formed using a drill, plate and split process to provide the segments 26a, 26b while subtractive (e.g. etching) or additive (e.g. deposition) techniques can be used to provide the pads 27. In this embodiment, PCB 10' includes at least two layers which correspond to signal layers of the multi-layer structure 25. The MCV 26 provides a signal path between a first signal trace 27a on one signal layer of the multi-layer structure 25 and a second signal trace 27b on a different signal layer of the multi-layer structure 25. The signal traces 27a, 27b are typically provided as conductive material deposited or otherwise provided on the signal layers of the multi-layer structure using conventional deposition or etching techniques. The signal traces 27a, 27b may be provided in any printed circuit transmission line configuration including but not limited to stripline, microstrip and co-planar waveguide configurations.

Figure 1B:
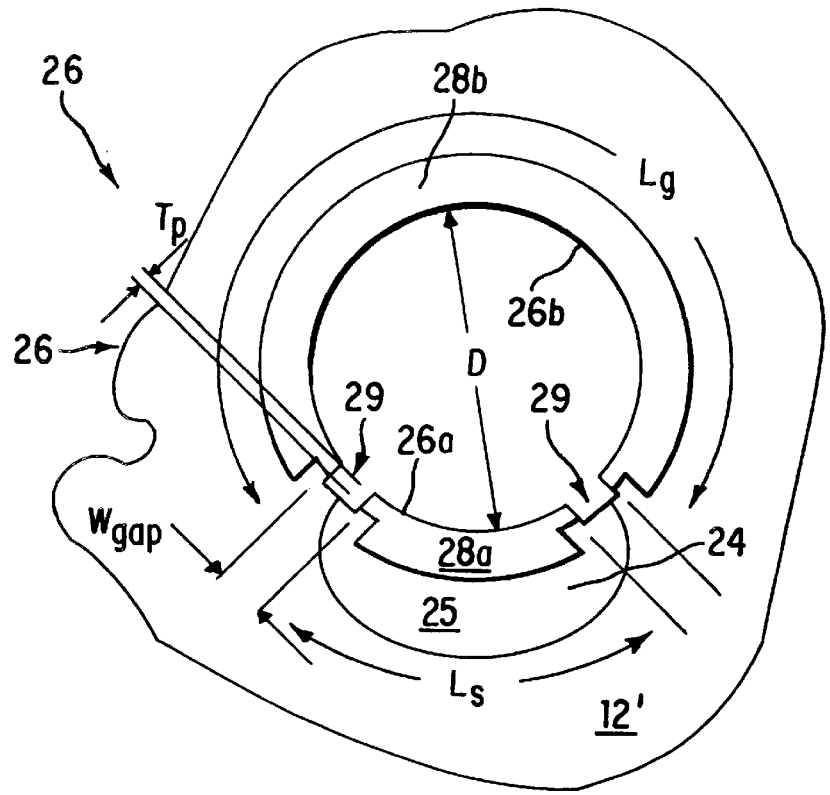
FIG. 1B is a top view of a symmetrically split multi-connection via.

Referring now to FIG. 1B in which like elements of the MCV 26 in FIG. 1A are provided having like reference designations, the MCV 26 has a diameter D, a plating thickness $T_p$ and includes the signal and ground segments 26a, 26b and pads 28a, 28b.

As can be clearly seen in FIG. 1B, the MCV 26, has a non-symmetric geometry in which the arc length $L_s$ of the signal segment 26a is smaller than the arc length $L_g$ of the ground segment 26b. As can also be clearly seen in FIG. 1B the ground plane layer 12' has a portion thereof removed to provide the region 24 in which is exposed a surface 25a of the dielectric support structure 28. Each of the ground plane layers 12' (FIG. 1A) are also provided having portions thereof removed to expose regions of the dielectric core or support structure proximate the MCV.

The reflection and transmission characteristics of the MCV 26 can be controlled by varying the width $W_{gap}$ of the regions 29, and the arc lengths or widths $L_s$, $L_g$ of the signal and ground segments 26a, 26b and the size and shape of the regions 24. It has been found that the MCVs are provided having favorable electrical characteristics of when the arc length of the signal segments are narrower than the arc length of the ground segments.

It should be appreciated that the multi-connection via structure can be considered as having a co-cylindrical waveguide structure which is analogous to the structure of a co-planar waveguide. As in a co-planar waveguide, a co-cylindrical waveguide maintains impedance control between signal and ground segments. Thus, in a manner similar to a co-planar waveguide, the multi-connection co-cylindrical waveguide via structures achieve impedance match by controlling diameter, signal arc length and gap relative to ground segment and ground plane clearances.

Figure 1C:
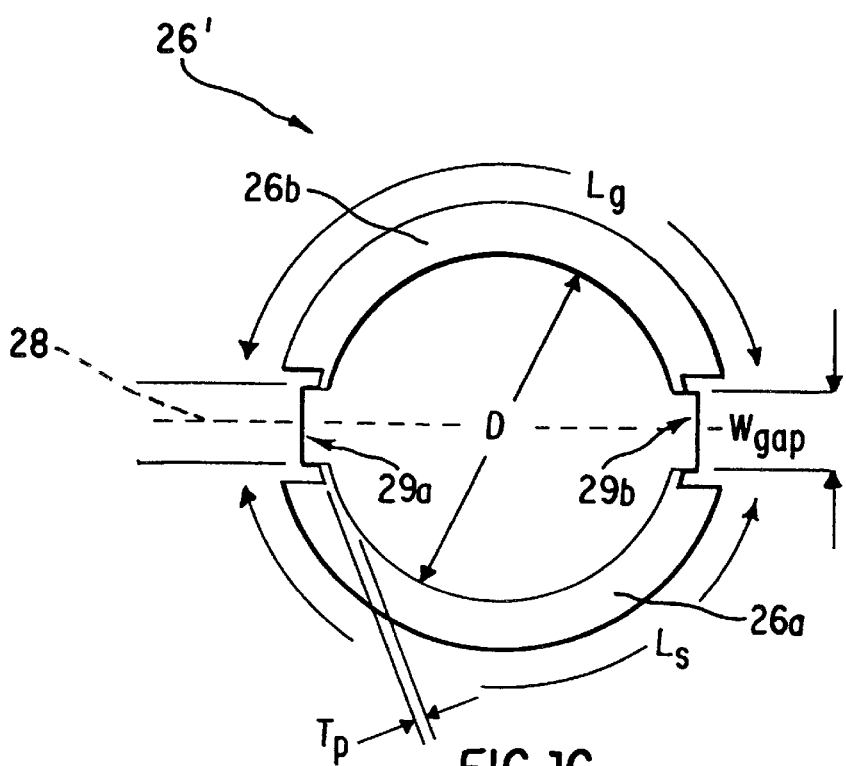
FIG. 1C is a top view of a non-symmetrically split multi-connection via.

Referring now to FIG. 1C, an MCV 26' is shown having a symmetric geometry in which the MCV 26' is split symmetrically about a central horizontal axis 28 of the MCV 26' to provide a pair of nonconductive regions 29a, 29b (also referred to as spaces or gaps) which electrically isolate the signal segment 26a' and the ground segment 26b'. The signal segment 26a and ground segment 26b are thus provided having equal arc lengths $L_s$, $L_g$ respectively. Regions 29a, 29b may be provided as dielectric regions (e.g. provided from portions of a PCB in which the MCV 26' is formed) or from air filled spaces.

In one particular example, a symmetrically split MCV 26 was provided having a diameter of about 0.559 mm and the width of gap regions 29a, 29b was varied. When the gap increased, the signal conductor and ground conductor arc lengths were decreased by an equal amount to thus maintain symmetry. The closest coupling between the signal and ground occurs at the gaps 29a, 29b. Thus, varying the width $W_{gap}$ of the gap 29a, 29b has a significant effect on such coupling and therefore on reflection and transmission characteristics of the MCV. The best results were achieved with a gap width of about 254 $\mu$m.

Examination of test results reveals that the reflections drop off to near zero as the gaps 29a, 29b were widened until a gap width was reached at which the reflection was a minimum. It is expected, however, that if the gaps were widened beyond a certain point, (requiring a larger diameter MCV) the reflected power would eventually increase.

The energy that is reflected in a conventional PTH increases at a greater rate than that of MCVs with frequency. Thus the benefits of the MCV structure is greater at higher frequencies. In a best-tuned case, the reflected energy by the MCV is negligible across the frequency range. The stubs formed by those portions of the multi-connection via segments which extend above and below the signal traces coupled to the via segments can dominate reflection characteristics of the MCV. Relatively large reflections can occur at frequencies corresponding to resonant frequencies of the stubs. In some cases pads (e.g. pads 21a, 21d in FIG. 1) at the end of the MCV may also be a source of reflections..

Examination of experimental test results show that transmission is consistent with the reflections. A decrease in reflected power increases the transmitted power proportionally. This is an important interaction to note, since it is possible to decrease both the reflection and the transmission, e.g. if losses due to EMI are high.

Examination of experimental results to determine the affect of varying the conductor ratio on reflections and transmissions shows that varying the arc length $L_s$ of the signal conductor 26a tunes the MCV structure somewhat better than varying the width $W_{gap}$ of the gaps 29a, 29b and keeping the arc lengths $L_s$, $L_g$ of the ground and signal segments 26a, 26b symmetric. In this case, as the signal arc-length decreases below 520 $\mu$m, the reflections begin to increase at higher frequencies. This implies that these via structures are inherently tunable to the circuit to which the MCV is coupled (e.g. transmission lines 27a, 27b in FIG. 1A). Conventional PTHs can attain some performance gains by decreasing the size and increasing the ground clearance, (both of which are difficult to achieve) but otherwise provide no means for true impedance tuning.

Examination of experimental test results to determine the affects of varying the diameter of MCVs on reflections and transmissions reveals that reducing the signal arc length $L_s$ reduces reflections to the same range as MCVs having smaller diameters. Thus, an MCV having a relatively large cross-sectional diameter is as tunable as an MCV having a relatively small cross-sectional diameter. This is in contrast to conventional PTH approaches in which increasing the via diameter increases the reflections and decreases the transmission, thus indicating sensitivity to diameter.

The above tuning characteristic of MCVs is significant in that it indicates that larger diameter MCVs, which are easier to manufacture, employ better impedance control than the smallest conventional PTH. In other words, reflections and transmission in conventional PTHs are highly sensitive to cross-sectional diameter, while impedance-tuned MCVs are not.

Figure 1D:
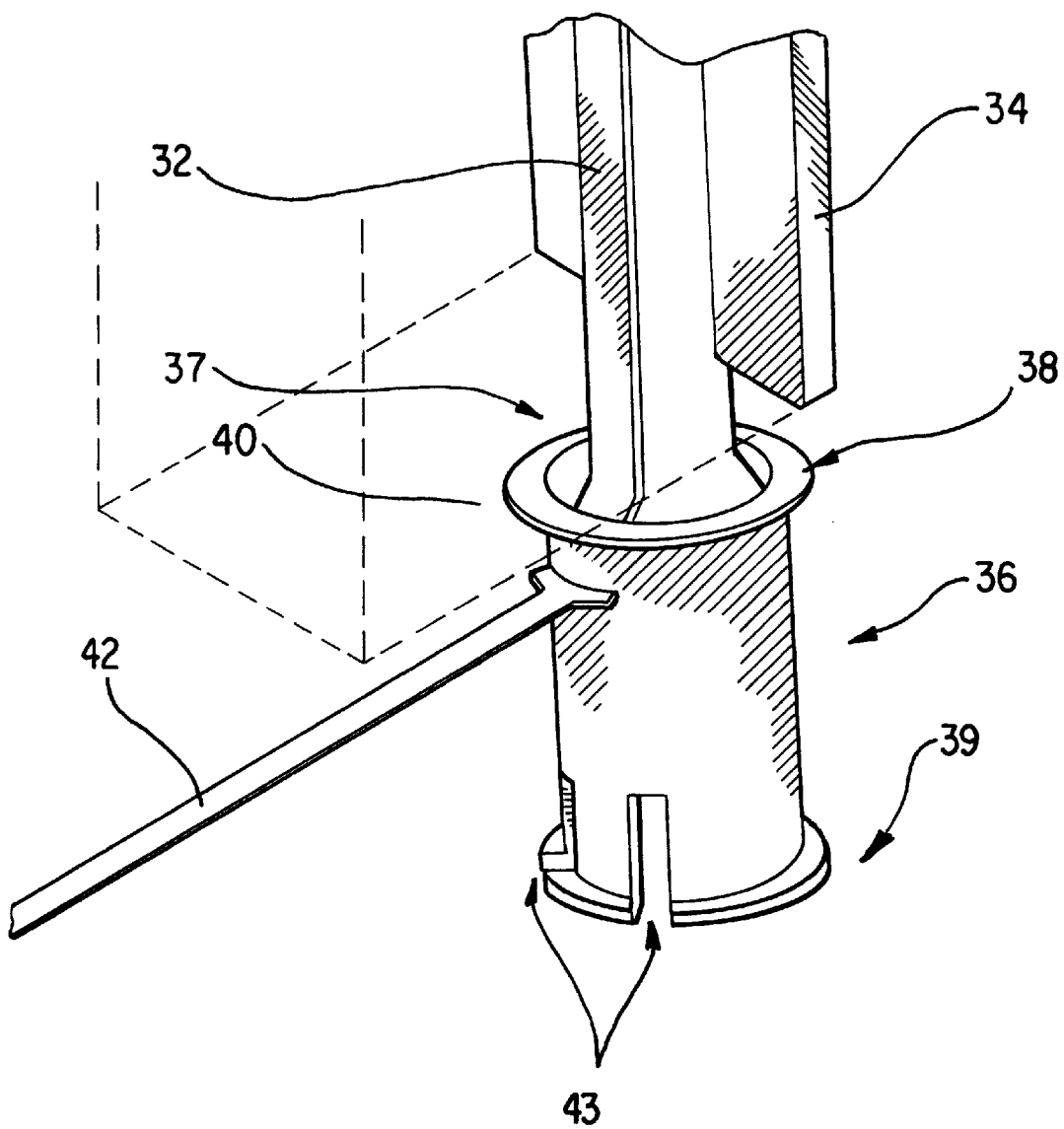
FIG. 1D is a diagrammatical perspective view of a multi-connection via launch.

Referring now to FIG. 1D, a connector 30 having a signal contact 32 and ground contact 34 partially disposed in an MCV 36 provides a multi-connection via launch (an MCV launch). The MCV 36 is provided in a portion of a printed circuit board (PCB) 37 which may be provided from a dielectric material such as FR4 or any other material having similar mechanical and electrical characteristics or otherwise suitable for manufacture of PCBs. The MCV 36 includes a ground via segment 38 coupled to a ground plane 39 and a signal via segment 40 having a signal trace 42 coupled thereto.

In one particular example, the MCV launch is provided having a diameter of about 1.5 mm since at this diameter the MCV launch is easily manufactured and provides space for a pair of contacts. The arc length of the signal via segment 40 is selected to be about 540 $\mu$m and the gap or split 43 between the ground via segment 38 and the signal via segment 40 is about 254 $\mu$m. A signal is launched into the PCB signal trace 42 and exits on a connector (the launch portion of which is shown in FIG. 1D) both of which are impedance matched to 50$\Omega$. With these parameters, a relatively good impedance match is provided between the connector and the PCB signal trace 42.

Since the impedance characteristics of the MCV 36 can be controlled, the MCV 36 can act as an impedance matching structure between the connector and the signal trace 42 on the PCB. This arrangement solves the problem of device and connector launch to the PCB which represents a major discontinuity in a signal path. The performance benefits provided by the MCV's impedance-controlled structure throughout the transition thus carry over to PCB connector and device launches.

Figure 2:
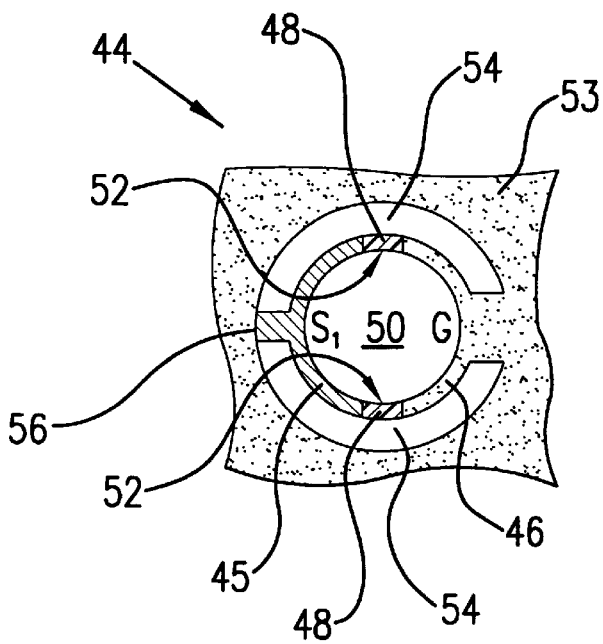
FIGS. 2–2C are a series of top views illustrating different single-ended via structures.
Figure 2A:
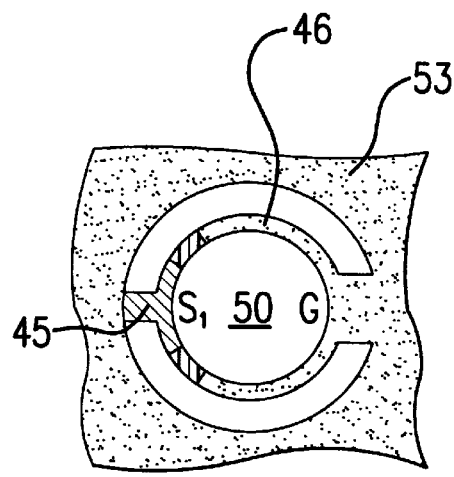
Figure 2B:
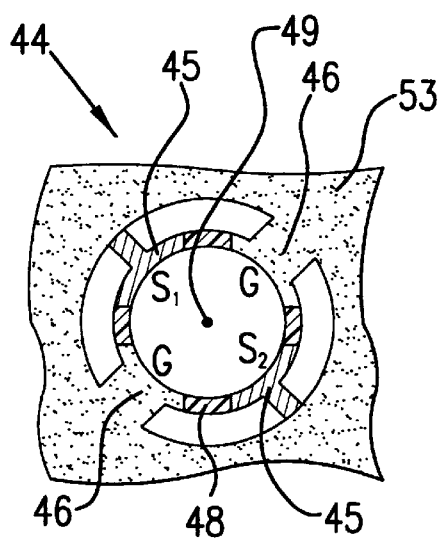
Figure 2C:
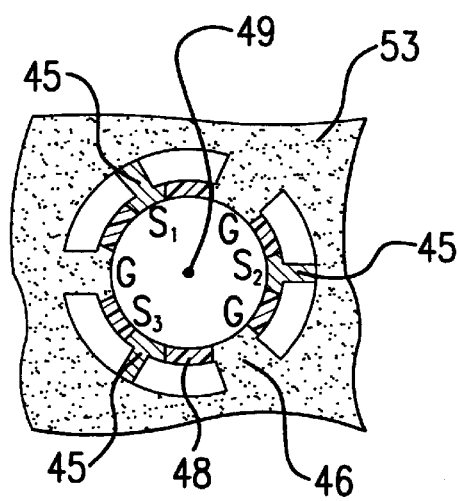

Referring now to FIGS. 2–2C a series of views illustrating single end via structures are shown. In FIGS. 2–2C, like reference designations correspond to like elements throughout the several views. As shown in FIG. 2, an MCV 44 includes a signal line segment 45 and a ground segment 46 which are electrically isolated from each other. It should be noted that in this particular embodiment, the signal and ground segments 45, 46 are provided having equal arc lengths (also sometimes referred to herein as "widths"). The signal and ground segments 45, 46 are provided by forming a hole in a PCB and depositing, plating or otherwise providing conductive material on the surface of the PCB which defines the hole. The signal and ground segments 45, 46 are electrically isolated by forming non-conductive regions 48. Regions 48 represent printed circuit board areas exposed during drilling and/or other procedures performed to provide the MCV 44 and the nonconductive spaces 52 between the signal line segments 45 and the ground segment 46. To prevent exposed PCB regions 48 (and in particular surface 52) from absorbing moisture and to otherwise protect the regions 48 (and in some cases to strengthen the MCV 44), a central region 50 of the MCV 44 is filled with a material which may, for example be provided as a dielectric material such as an epoxy. It should be noted that in some applications, sealing may not be required..

A ground plane 53 is disposed about MCV 44 and electrically contacts the ground segment 46. Regions of the ground plane 53 have been removed to provide nonconductive areas 54. As explained above in conjunction with FIG. 1, in preferred embodiments, no conductive material is present in the region of a signal line 56 contacting the signal line segment 45 and thus the ground plane 53 is provided having a non-symmetric pattern in the region of the MCV.

The width of the gaps 52, the arc lengths of the signal and ground segments 45, 46, the diameter of the hole 48 and the layer combinations (e.g. thickness, relative dielectric constant, number of layers, etc . . . ) of the PCB may all be varied to provide the MCV 44 having a predetermined impedance characteristic.

Referring now to FIG. 2A, it should be noted that the signal and ground segments 45, 46 are provided having un-equal arc lengths. In this particular embodiment, the arc length of signal segment 45 is smaller than the arc length of ground segment 46. In other embodiments, however, it may be desirable to provide signal segment 45 with an arc length which is greater than the arc length of ground segment 46. In this case, other features (e.g. spacing between the ground and signal segments, 45, 46, diameter of the MCV, etc. can be selected to provide an MCV having an appropriate impedance characteristic.

The MCV embodiments of FIGS. 2 and 2A were tested by providing layer connections between like spaced layers signal layers. The signal arc length was varied but the diameters of the MCVs were kept the same in all tests.

The results of the tests are summarized in Table I below which shows the reflection amplitude for a variety of different signal conductor arc lengths for MCVs having a diameter of 1.5 mm.

TABLE I

| Signal conductor arc length | Reflection amplitude |
| --- | --- |
| 0.19 mm | 2.0% |
| 0.31 mm | 1.0% |
| 0.49 mm | 2.2% |
| 0.74 mm | 3.6% |
| 0.90 mm | 3.0% |
| 1.09 mm | 8.4% |
| 2.13 mm | 12.7% |

Examination of Table I reveals that an MCV having a relatively large diameter with a wide signal conductor arc length has worse performance than a via having a smaller diameter. As the arc length is decreased, the reflection reduces to near zero (in the case where L, equals 0.31 mm) and then the reflection increases again (in the case where $L_s$ equals 0.19 mm). It is interesting to note that in digital electronics, vias are capacitive in nature (i.e., yielded negative broadband reflection), while the over compensated multi-connection via here is inductive.

Referring now to FIG. 2B, an MCV 44 includes a pair of signal segments 45 and a pair of ground segments 46 symmetrically disposed about a central longitudinal axis 49 of the MCV 44. The signal and ground segments 45, 46 are each provided having equal arc lengths. It should be noted however, that in some applications it may not be desirable or necessary to provide the signal and ground segments having equal arc lengths. For example, the width of the signal segment may be selected to correspond to the width of a signal trace which terminates on the signal segment of the MCV.

Referring now to FIG. 2C, an MCV 44 includes triplet signal segments 45 and triplet ground segments 46 symmetrically disposed about a central longitudinal axis 49 of the MCV 44. The signal and ground segments 45, 46 are each provided having equal arc lengths.

Referring now to FIGS. 3–3E a series of views illustrating differential via structures are shown. The primary difference between a single-ended MCV and a differential MCV is that in a single-ended MCV the signal propagates between ground return structures. In the differential case, the return path is a discrete conductor equal and opposite to another conductor. The ground in a differential signal acts as a drain for leakage caused by symmetry imperfections. In PCBs which include circuit components operating at relatively high clock speed (i.e. high-frequency circuits) differential signal pairing may provide performance advantages, especially for long traces. In FIGS. 3–3E, like reference designations correspond to like elements throughout the several views.

As shown in FIG. 3, an MCV 60 includes signal line segments 61a, 61b which are provided by plating, depositing or otherwise adhering a conductive material to the walls of a hole formed in a PCB. The central portion 62 of MCV 60 is filled with a dielectric such as air or an epoxy. Portions 63 represent printed circuit board areas exposed during drilling and other procedures to provide the MCV 60 and the signal line segments 61a, 61b. It should be noted that in this particular embodiment, the signal line segments 61a, 61b are provided having equal arc lengths In the case where the structure is for a differential signal the signal segments must be symmetric top achieve desired transmission and reflection characteristics.

A ground plane 64 is disposed about MCV 60. Although not shown in this view, it will be appreciated by one of ordinary skill in the art that multiple layers of the PCB in which the MCV exists may correspond to ground plane layers. This is also true of each of the embodiments of FIGS. 3–3E. Signal lines 58a, 58b and signal line segments 61a, 61b to which the signal lines 58a, 58b are respectively coupled are on different layers than the ground plane 64 and thus are electrically isolated from the ground plane 64. In FIG. 3, one differential signal pair (i.e. signal lines 58a, 58b) couples to MCV 60 on one signal layer and a second differential signal pair (not visible in FIG. 3) couples to MCV 60 on a second different signal layer. Portions of the ground plane 64 have been removed to provide nonconductive areas 65. It should be noted that signal lines 58a, 58b connect to MCV segments 61a, 61b toward a first end of the segments 61a, 61b. It should be noted that the traces coming into a differential via will also be of differential construction (e.g. differential stripline or microstrip construction). Thus, the signal traces will have a particular spacing which ideally will be maintained right up to the via.

The width of the gaps 63, the arc lengths of the signal segments 61a, 61b, the diameter of the hole 62, ground clearance distance and shape 65, and the layer combinations (e.g. thickness, relative dielectric constant, number of layers, etc . . . ) of the PCB may all be selected to provide MCV 60 having a predetermined impedance characteristic.

Referring now to FIG. 3A, it should be noted that in this embodiment, a ground segment 64a is disposed between two ends of the differential signal paths 61a, 61b. The signal and ground segments 61a, 61b and 64a are each provided having equal arc lengths.

The width of the gaps 63, the arc lengths of the signal segments 61a, 61b, and ground segments 64a, the diameter of the hole 62, ground clearance distance and shape 65, and the layer combinations (e.g. thickness, relative dielectric constant, number of layers, etc . . . ) of the PCB may all be varied to impact the impedance characteristics of the MCV 60.

Referring now to FIG. 3B, it should be noted that in this embodiment, the ground segment 64 a is disposed between two ends of the differential signal segments 61a, 61b. The signal segments 61a, 61b are each provided having equal arc lengths while the arc length of the ground segment 64a is smaller than the arc lengths of the signal segments 61a, 61b. It should be noted that an equally effective alternative would be to provide the arc length of the ground segment 64a larger than the arc length of the signal segment.

As mentioned above in conjunction with FIG. 3A, the width of the gaps 63, the arc lengths of the signal segments 61a, 61b, and ground segments 64a, the diameter of the hole 62, ground clearance distance and shape 65, and the layer combinations (e.g. thickness, relative dielectric constant, number of layers, etc . . . ) of the PCB may all be varied to impact the impedance characteristics of the MCV 60.

Referring now to FIG. 3C, an MCV 60 includes signal line segments 61a–61c which are provided in any suitable manner. In this particular embodiment, the signal line segments 61a–61c are symmetrically disposed about a central longitudinal axis and are provided having equal arc lengths.

The ground plane 64 is disposed about MCV 60 the signal lines 58a, 58b and signal line segments 61a–61c to which the signal lines 58a–58c are respectively coupled are on different layers than the ground plane 64 and thus are electrically isolated from the ground plane 64. Portions of the ground plane 64 have been removed to provide nonconductive areas 65. It should be noted that no drain is provided in this embodiment and that without a drain between multiple-differential pair sets, there is crosstalk. Thus, this embodiment would not be preferred.

Referring now to FIG. 3D, an MCV 60 includes signal line segments 61a–61f which are provided in any suitable manner. In this particular embodiment, the signal line segments 61a–61f are symmetrically disposed about a central longitudinal axis and are provided having equal arc lengths. It should be noted that orientation of the signal line segments in each of FIGS. 3D and 3E can vary from hole to hole to provide the best trace routing in the PCB.

The ground plane 64 is disposed about MCV 60 the signal lines 58a–58f and signal line segments 61a–61f to which the signal lines 58a–58f are respectively coupled are on different layers than the ground plane 64 and thus are electrically isolated from the ground plane 64. Portions of the ground plane 64 have been removed to provide nonconductive areas 65. It should be noted that no drain is provided in this embodiment and that without a drain between multiple-differential pair sets, there is crosstalk. Thus, this embodiment would not be preferred.

Referring now to FIG. 3E, an MCV 44 includes MCV signal line segments 61a–61d a first ground segment 64a disposed between two the differential signal paths 61a, 61d and a second ground segment 64b disposed between two the differential signal paths 61b, 61c. The signal segments 61a–61c are each provided having equal first arc lengths and the ground segments 64a, 64b are each provided having equal second arc lengths. In some applications it may be desirable to make the first and second arc lengths equal lengths while in other embodiments it may be desirable to make the first and second arc lengths unequal(that is the differential pair signal segments should have equal arc lengths, but the ground drain can be provided having and arc length which is either larger or smaller than the arc length of the signal segments.

In this particular embodiment, the ground segments 64a, 64b are diametrically opposed and the MCV signal line segments 61a–61d are symmetrically disposed on opposite sides of a plane of the MCV 60 which passes through ground segments 64a, 64b along a horizontal center line of the MCV 60.

The ground plane 64 is disposed about MCV 60 and the signal lines 58a–58d and signal line segments 61a–61d to which the signal lines 58a–58d are respectively coupled are on different layers than the ground plane 64 and thus are electrically isolated from the ground plane 64. Portions of the ground plane 64 have been removed to provide nonconductive areas 65. Ground segments 64a, 64b are coupled to ground plane 64. Because there is a ground drain between signal pairs experiments have show that there is no cross talk, therefore this configuration would be preferred for multiple signal sets in a single via.

Figure 4:
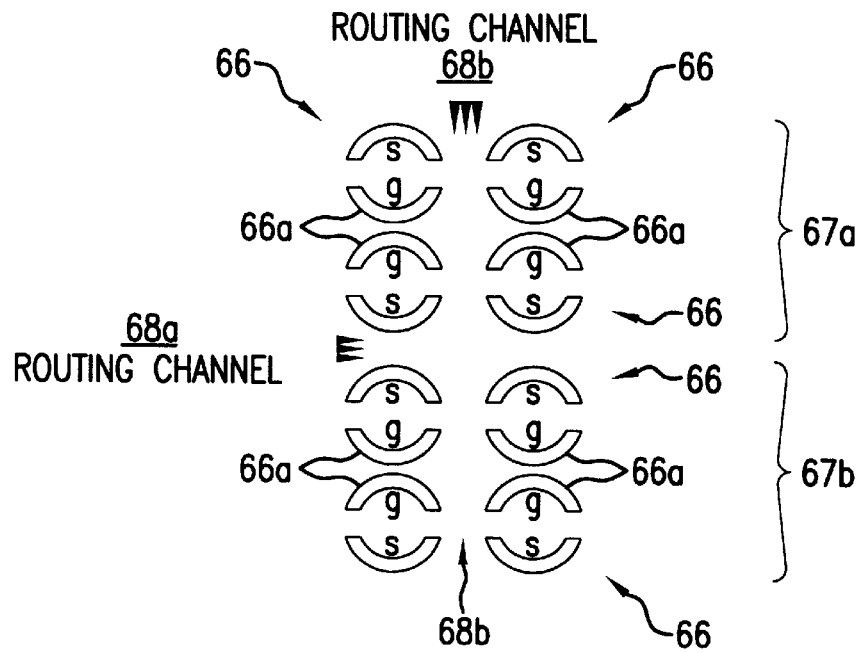
FIGS. 4–4B are a series of views illustrating clusters of multi-connection vias.
Figure 4A:
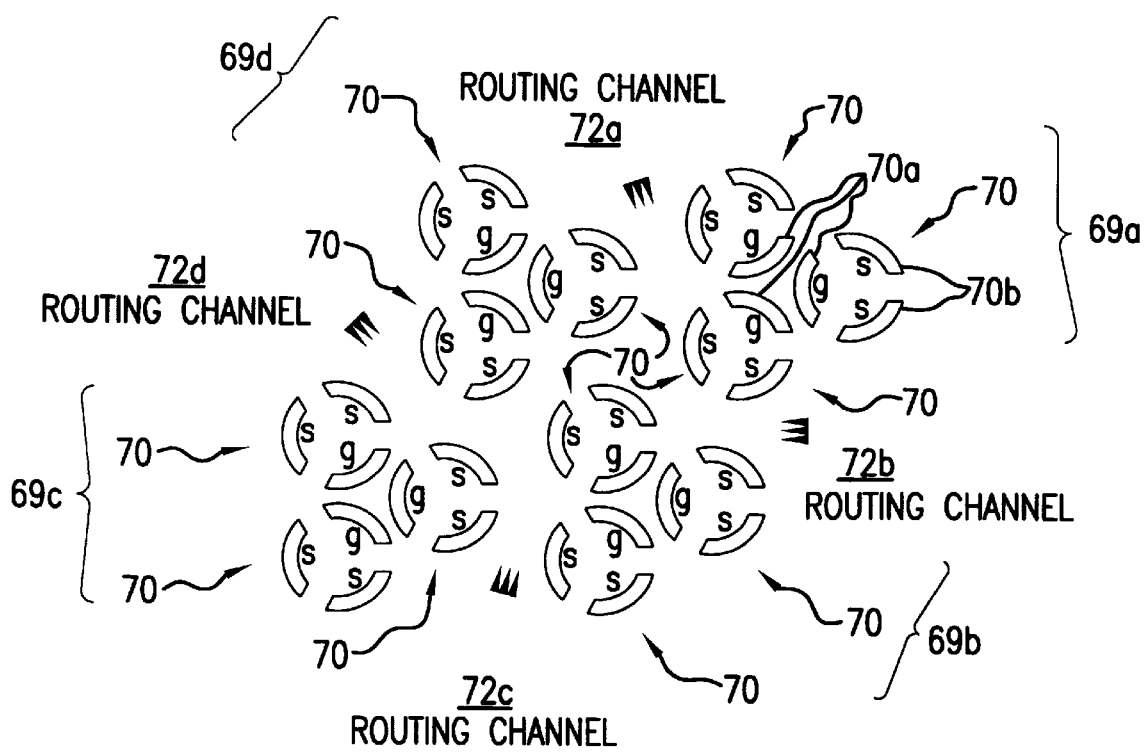
Figure 4B:
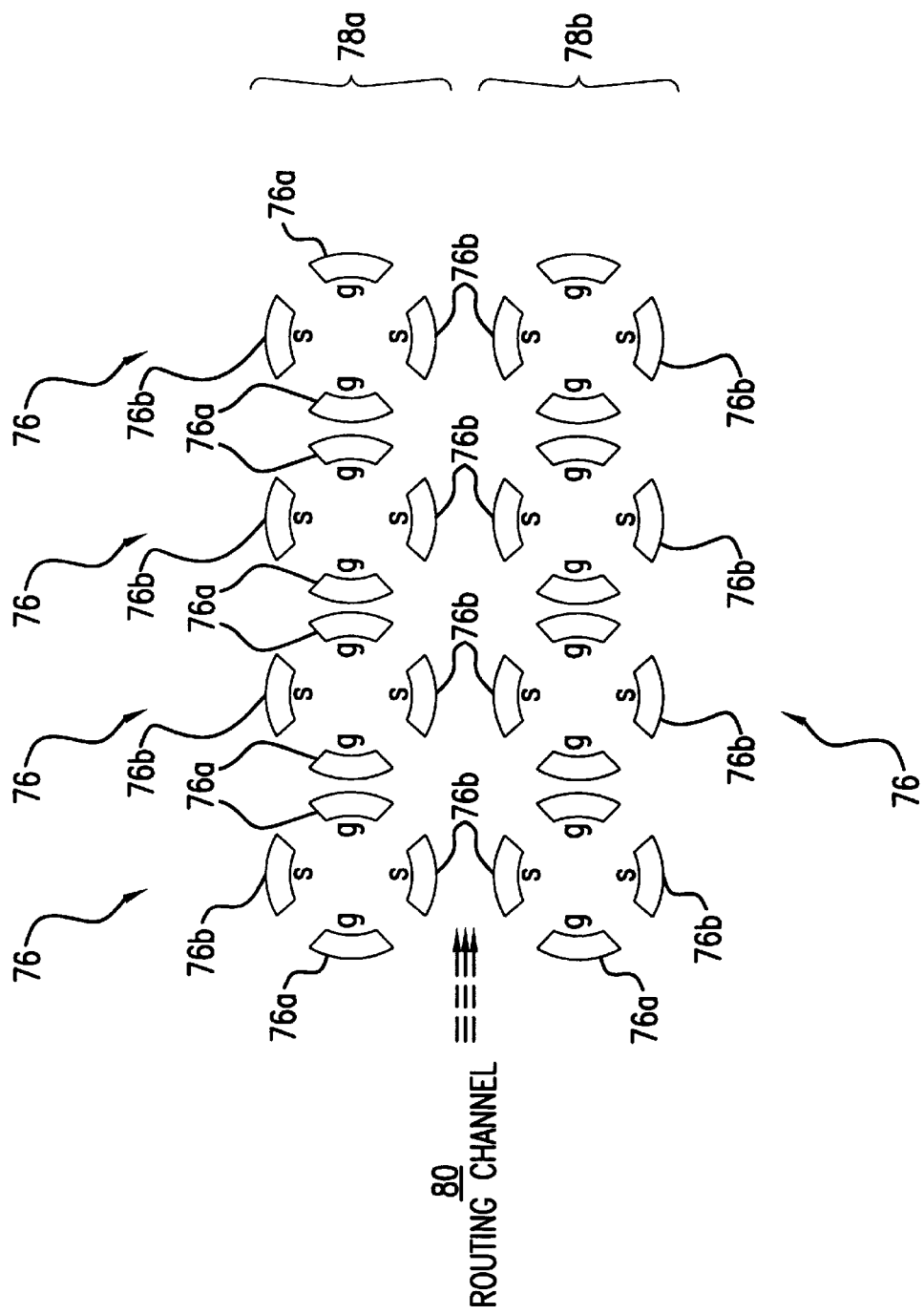

Referring now to FIGS. 4–4B in which like elements are provided having like reference designations throughout the several views, a series of clusters of multi-connection vias 66 are shown.

Referring first to FIG. 4, a plurality of two-connection vias 66 clustered in pairs 67a, 67b define routing channels 68a, 68b which pass on either side of the clusters 67a, 67b. Ground vias 66a are juxtaposed with zero trace spacing between them. Because there is no need for a keep-out zone between the ground sides of the vias 66a, connection density increases.

Referring now to FIG. 4A, one electrical form of MCV that particularly benefits from multi-connection vias is the differential pair. In its simplest form, a differential pair MCV provides two connections over which can be transmitted signals in opposed phase. Because a perfectly balanced differential pair is not possible, it is desirable to have a ground drain close to the pair. FIG. 4A illustrates clusters 69a–69d of three three-connection vias 60. Each three-connection includes a ground drain 70a and a differential pair (i.e. signal segments) 70b. The ground sides 70a of the MCVs 70 vias are juxtaposed in a zero trace condition and thus no keep-out zone is necessary thereby increasing connection density. The clusters 69a–69d are arranged to define routing channels 72a–72d which pass on either side of the clusters 69a–69d.

Referring now to FIG. 4B, a plurality of four-connection vias 76 are grouped in clusters 78a, 78b. Each four-connection via 76 includes a pair of ground drains 76a and a pair of signal segments 76b. The ground sides 76a of the MCVs 76 are juxtaposed in a repeating pattern which thus provides higher connection densities than prior art techniques. The clusters 78a, 78b are arranged to define a routing channel 80 which passes between the clusters 78a, 78b.

As demonstrated by the examples shown in FIGS. 4–4B, the possibilities for multi-connection via arrangements are numerous. One consideration in routing multi-connection vias is clearance around the via structure. The distance between the signal side (e.g. segments 76b) and the trace is much larger than that of the ground side (e.g. segments 76a), primarily due to the ground plane clearance. This clearance requires traces on the layers above and below the ground plane to not be routed in the clearance areas, thereby avoiding potential impedance mismatch in the trace and minimizing crosstalk from the signal via. On the via ground side, the ground plane is uninterrupted, because there is little or no field on this side. Therefore, clearance on the ground side can be set to just outside a minimum annular ring requirement.

It should be noted that the MCVs 66, 70 and 72 described above in conjunction with FIGS. 4–4B, may be provided having any of the appropriate geometries described above in conjunction with FIGS. 2–3E.

Figure 5:
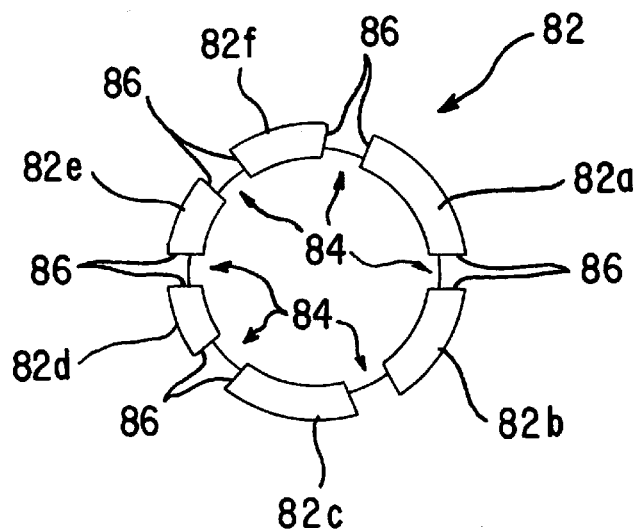
FIG. 5 is a diagrammatical illustration of a parallel split pads.

Referring now to FIG. 5, a multi-connector via 82 includes pad segments 82a–82f The pad segments are each spaced by a gap 84. The gap edges 86 are parallel and thus provide so-called "parallel splits" between the pad segments 82a–82f.

Figure 6:
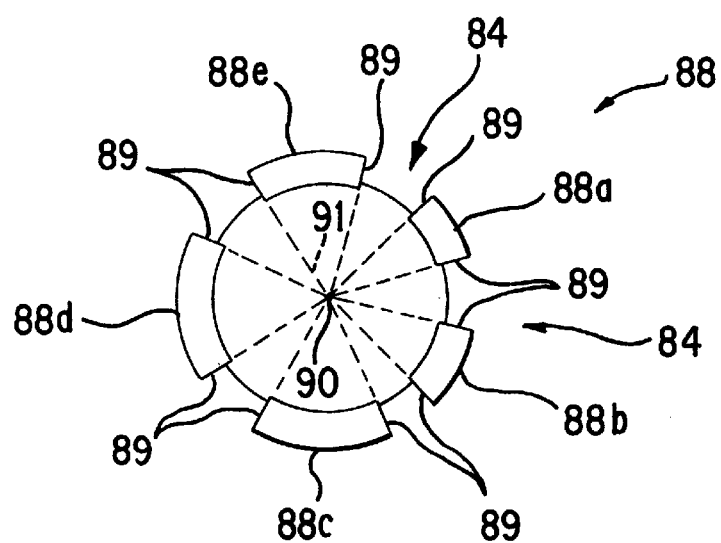
FIG. 6 is a diagrammatical illustration of a radial split pads.

The parallel split approach is in contrast to the so-called radial split approach as illustrated in FIG. 6. In the radial split approach, a multi-connector via 88 includes pad segments 88a–88f. The pad segments 88a–88f are each spaced by a gap 84. The gap edges 89 are formed at an angle with respect to each other so that a straight line (here shown in phantom as lines 91) drawn along a plane defined by each edge 89 intersects a center point 90 which is located along a central longitudinal axis of the MCV 88.

While MCVs with parallel and radial pad segments can be produced with equal ease, the parallel split provides greater arc length for traces to connect to. In some applications such additional arc length may be desirable since it may offer additional flexibility, considering the difficulty in routing from a specific direction to the MCV.

Referring now to FIGS. 7–7C a series of views illustrating a pad stack prior to drilling and plating for a single conductor shielded via, where signal layers without connections have no pad.

Referring first to FIG. 7, a pattern to be etched or otherwise formed in top and bottom pad layers of a multi-layer structure includes conductor regions 92 and 94 which will eventually correspond to a signal segment and a ground segment, respectively, of an MCV. Shown in phantom and indicated by reference numeral 95 is the diameter of hole to be drilled or otherwise provided (e.g. punched or cut) in a PCB which will be plated to form the MCV.

As shown in FIG. 7A, a conductor region 96 having a radial shape is disposed on each layer of the multilayer structure which will include a signal trace to be coupled to the MVC. As shown in FIG. 7B, each layer of the multilayer structure which will not include a signal trace does not include any conductor region in the area of the MVC. As shown in FIG. 7C a conductor region 97 provides a ground plane on the ground layers of the multilayer structure. Here portions 98 of the ground plane conductor 97 have been removed.

Once drilled, plated, and split, the pad stack appears as illustrated in FIGS. 8–8C. Referring first to FIG. 8, a hole 99 has been drilled through each of the layers. A portion of the conductor region 92 (FIG. 7) has been removed by the drilling process and the MCV signal segment 92' remains in the top and bottom pad layers as shown. Similarly, a portion of the conductor region 94 (FIG. 7) has been removed by the drilling process and MCV ground segment 94' remains in the top and bottom pad layers. The plated through hole has been spit to provide gaps 91 which define the signal and ground segments 92', 94'. As can be seen from FIGS. 8–8C, the splits 91 extend through each of the layers in the MCV.

As shown in FIG. 8A, a portion of the conductor region 96 (FIG. 7A) has been removed by the drilling process and an MCV signal segment 96' remains on each of the signal trace layers included in the multilayer structure. The signal segments 96' are each adapted to coupled the MCV to a signal trace. As shown in FIG. 8B, each layer of the multilayer structure which will not include a signal trace still does not include any conductor region in the area of the MVC but does include a layer of conductive plating 93 disposed on the surface of the hole or "barrel" portion of the MCV. The plating material 93 is the conductor which electrically couples each of the layers through which the MCV passes. As shown in FIG. 8C the conductor region 97 provides a ground plane on the ground layers of the multi-layer structure. The nonconductive region 98' is arranged above the signal segment pads 96' used to connect signal traces to the MCV.

Figure 9:
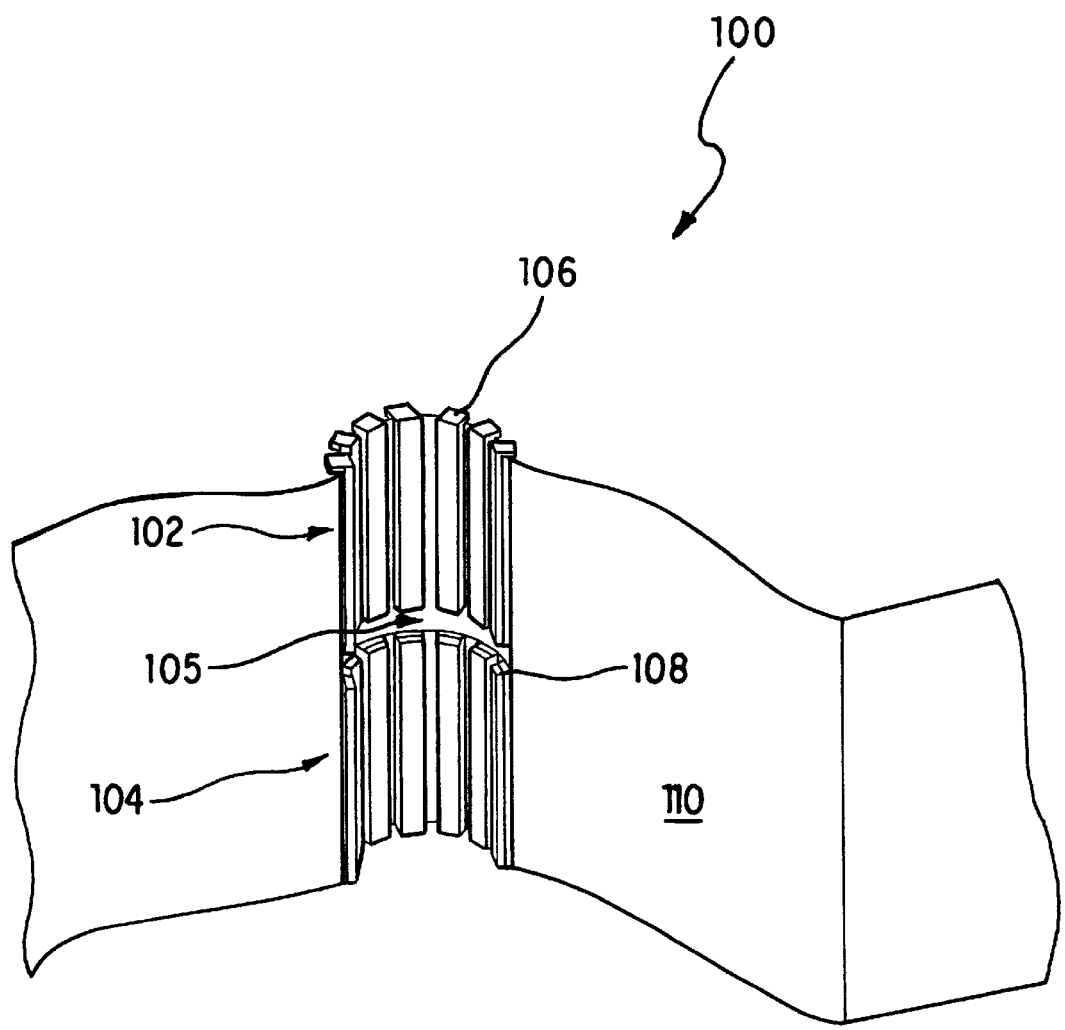
FIG. 9 is a perspective view of a two-dimensional split via.

Referring now to FIG. 9, a two-dimensional split via 100 including a multi-connection via 102 and a multi-connection via 104 are disposed within a multi-layer printed circuit board 110 as shown. The multi-connection via 102 includes a plurality of separate electrically isolated segments 106, each of which are connected to either a ground plane (not shown) or a signal trace (not shown) as required by the requisite circuitry of the printed circuit board 110 to connect circuitry (not shown) on one layer to another layer. The multi-connection via 104 includes a plurality of separate electrically isolated segments 108, each of which are connected to either a ground plane (not shown) or a signal trace (not shown) as required by the requisite circuitry of the printed circuit board 110 to connect circuitry (not shown) on one layer to another layer. The multi-connection via 102 and the multi-connection via 104 are disposed in the same hole within the printed circuit board 110, but electrically isolated from one another. A horizontal or radial split 105 exists between the two structures. In addition to increased layer-to-layer routing, horizontally-split vias can significantly reduce reflections caused by unused via extensions. In horizontal-split vias, each level operates as a separate set of connections, thereby improving space usage.

Figures 10, 10A:
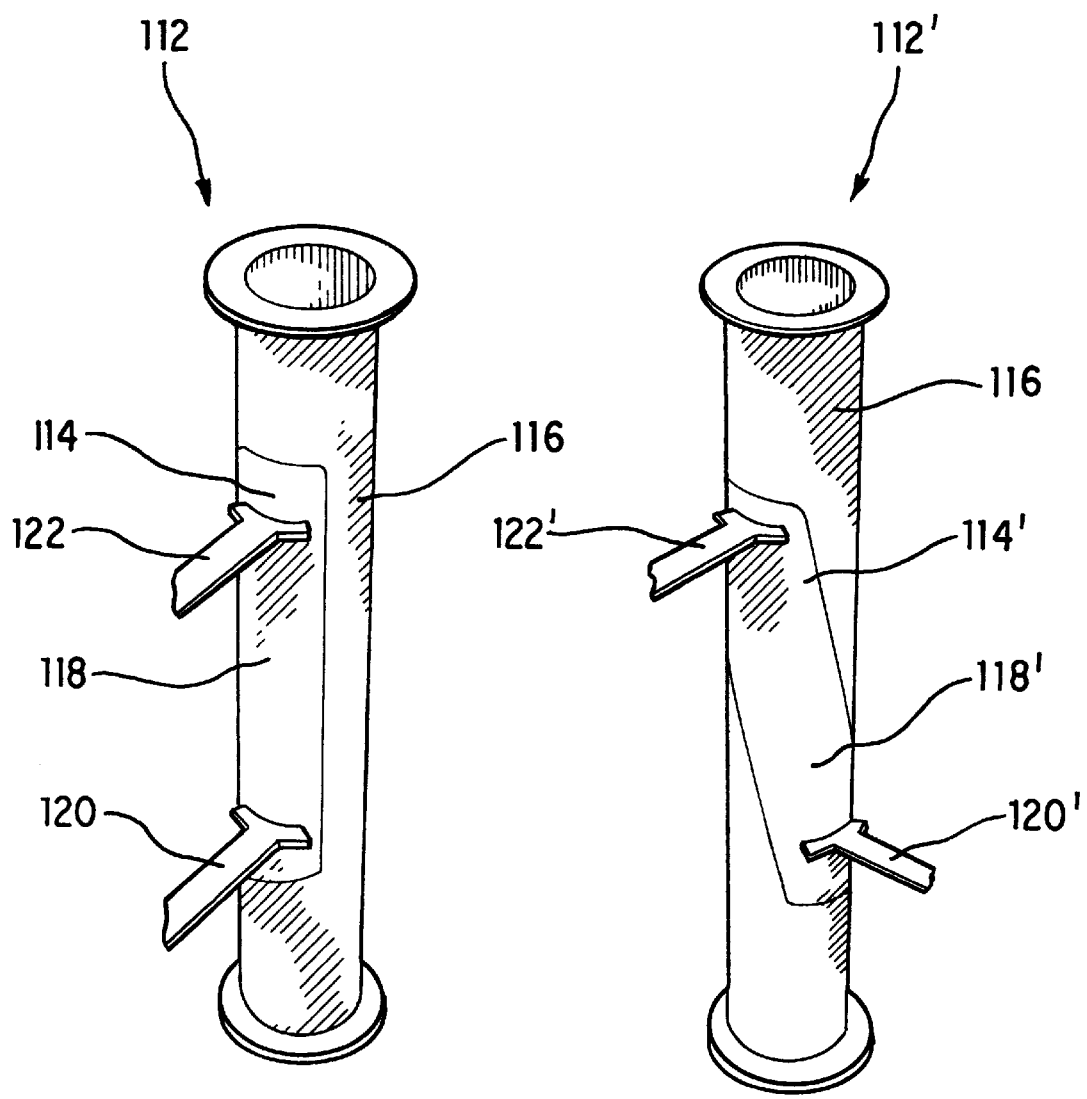
FIGS. 10–10A are a series of diagrammatical perspective views of in via signal traces.

Referring now to FIGS. 10 and 10A, an alternative to splitting vias, is to create traces on the inside of a via cylindrical surface. It should be noted that in FIGS. 10 and 10A to promote clarity only conductive traces and segments are shown.

As shown in FIG. 10, a signal trace 120 of one layer of a multi-layer printed circuit board can extend into a via 112 including a ground portion 116 and a signal portion 118 separated by a nonconductor 114 and connect to the signal portion 118. The signal portion 118 is also connected to a signal trace 122 on another layer of the multi-layer printed circuit board. With such an arrangement, a signal path from one layer can be connected to a signal path of another Layer and this arrangement also eliminates electrical stubs and EMI above and below the board from the via.

As shown in FIG. 10A, a signal trace 120' of one layer of a multi-layer printed circuit board can extend into a via 112' including a ground portion 116 and a signal portion 118' and connect to the signal portion 118'. The signal traces 120', 122' approach MCV 112 from different angles on different layers of a multi-layer printed circuit board. The signal portion 118' of MCV 112 traverses in both horizontal and vertical directions (i.e. signal portion 120 "twists") to connect to a signal trace 120' to a signal trace 122 '. With such an arrangement, a signal path from one PCB layer can be connected to a signal path extending at a different angle on another PCB layer. This technique can be used to provide flexibility in routing signal traces. For example, a signal trace must connect to a particular signal segment of an MCV and thus must be oriented in a particular manner relative the MCV. If the twist technique is used, then more options are available with respect to the orientation and location of MCV signal segments relative signal traces. The twist technique thus allows routing of signal traces to MCVs in the same manner that a signal trace would be routed to any plated through hole (i.e. without regard for the particular direction from which the signal trace intersects the via..

Figure 11:
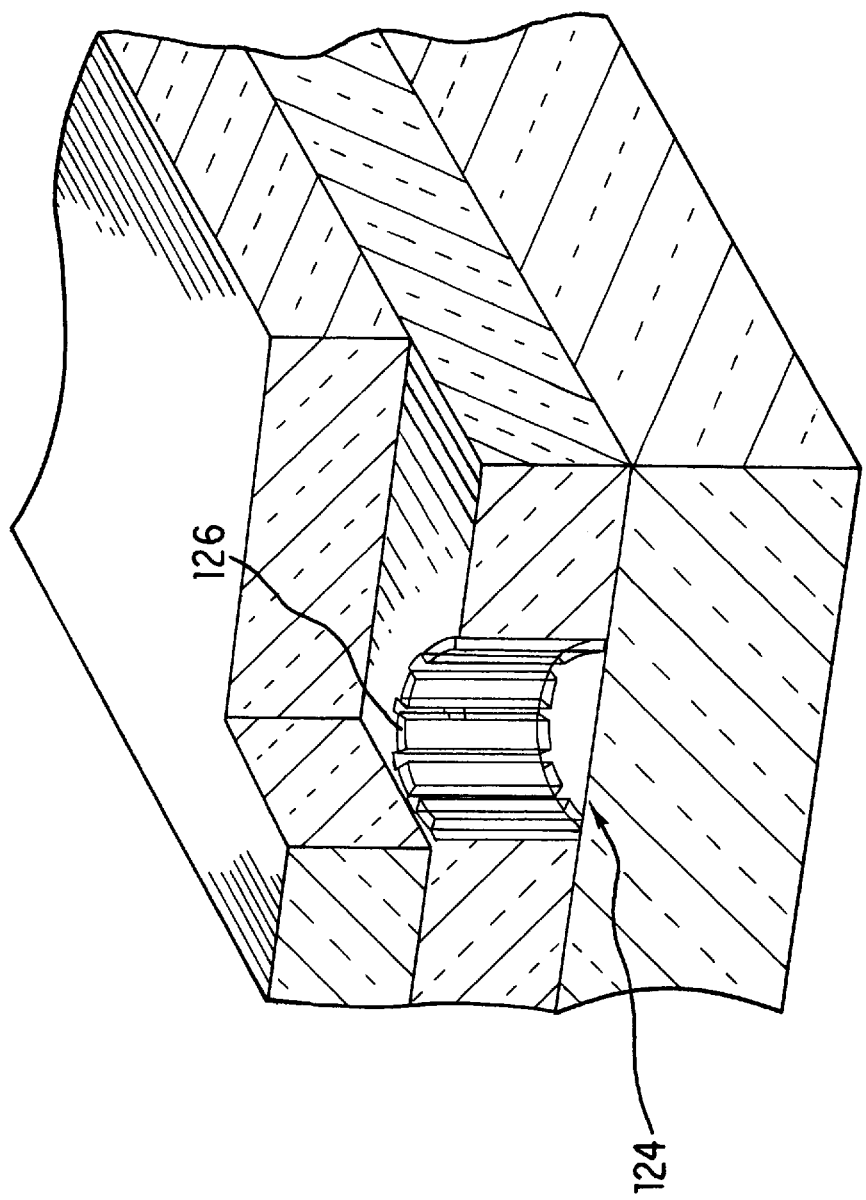
FIG. 11 is a perspective view of a buried multi-connection via.

Referring now to FIG. 11, a portion of a multi-connection via 124 embedded between layers of a multi-layer printed circuit board is shown. Such an embodiment is sometimes referred to as a "buried via." Although the buried via 124 is here shown providing connections between layer 125a, 125b, it should be appreciated that the via 124 could span more than two layers. The multi-connection via 124 includes a plurality of separate electrically isolated segments 126, each of which are connected to either a ground plane (not shown) or a signal trace (not shown) as required by the requisite circuitry of the printed circuit board to connect circuitry (not shown) on one layer to another layer.

With the use of the embedded multi-connection via 124, fewer vias are needed within the structure of the multi-layer printed circuit board to provide the same number of connections as can be made with conventional plated through holes. Thus the buried multi-connection via approach increases the connection density of the multi-layer printed circuit board. Furthermore, the buried mullet-connection via approach eliminates electrical stubs from unused portions of vias thereby reducing or in some cases eliminating EMI above and below the board, and resin or some other appropriate sealant can be disposed in the via (by natural flow or by injection techniques) to seal exposed fiber edges in the split. Although not explicitly shown in FIG. 11, it should be appreciated that each of the segments 126 may have pads (such as pad 28a, 28b in FIG. 1A) coupled thereto to provide a means for contacting portions of ground or signal layers in the PCB.

Figure 12:
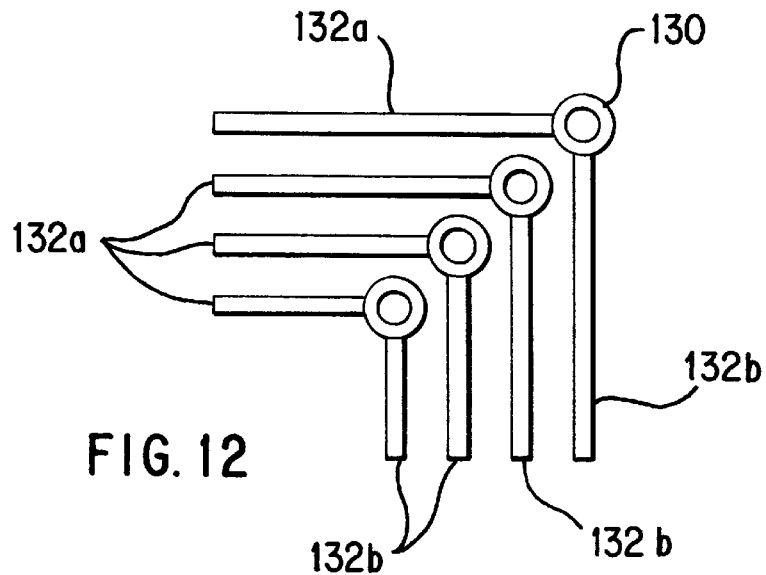
FIGS. 12–12E are a series of plan views illustrating signal trace routing paths through vias.
Figure 12A:
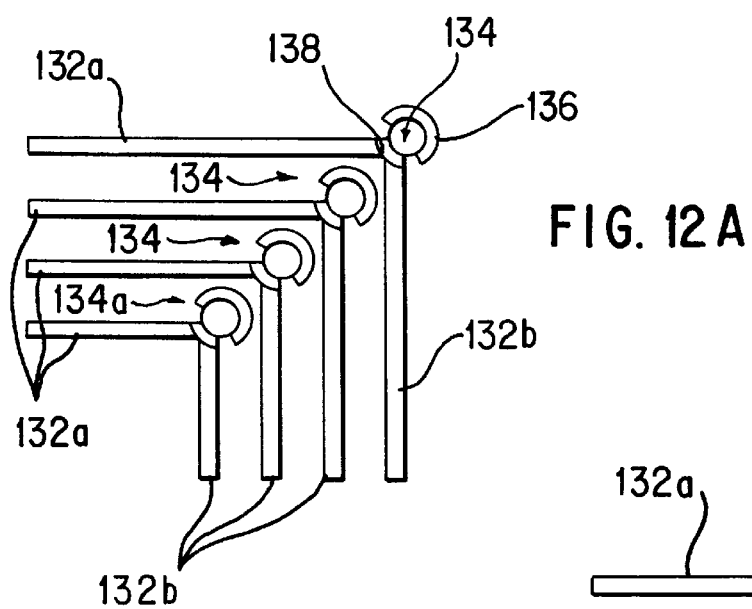
Figure 12B:
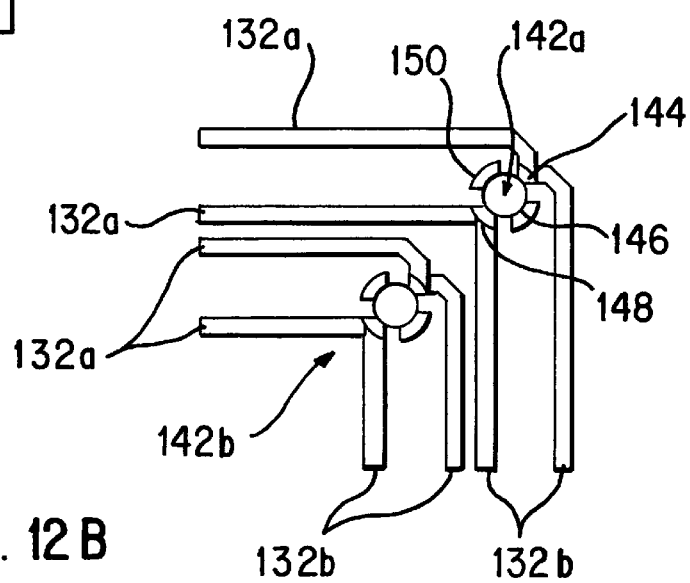
Figure 12C:
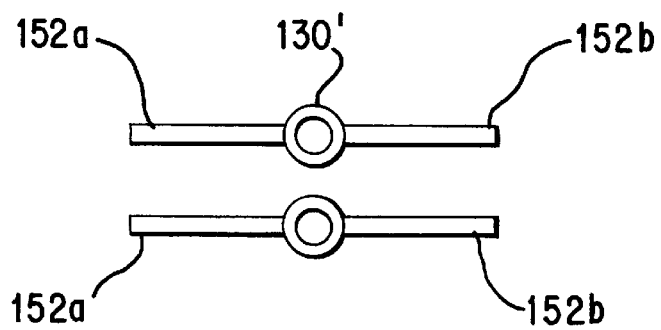
Figure 12D:
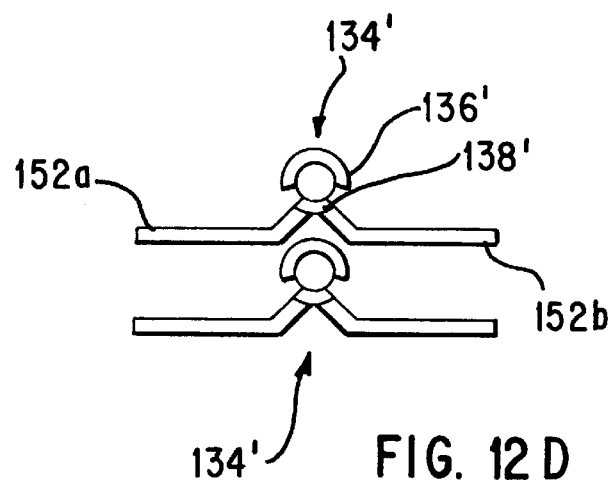
Figure 12E:
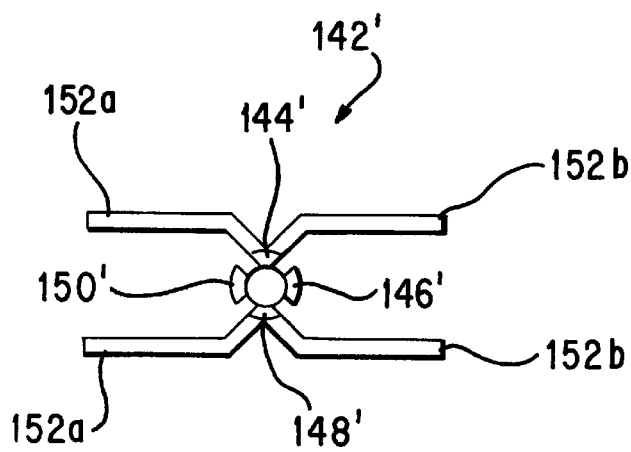

Referring now to FIGS. 12–12E, signal routing techniques taking advantage of the inventive MCV are described. FIG. 12 shows known routing techniques with conventional PTHs or vias 130 to pass a signal from one layer of a printed circuit board (also referred to as a printed wiring it board) to another layer. Using conventional PTHs 130, first signal paths 132 a enter the PTH 130 from a first direction and second signal paths 132b enter the PTH 130 from a second direction which is orthogonal to the first direction. It should be noted that in each of FIGS. 12–12E, the traces enter the via on one layer and exit on another. It should also be noted that not all signal traces such as traces 132a are on the same layer nor are all signal traces such as signal traces 132b on the same layer.

FIG. 12A shows a routing technique using four MCVs 134 to route signal paths 132a from one layer of the printed circuit board to another layer. In this embodiment, each of the MCVs 134 include a ground segment 136 which can be connected to a ground plane layer on the printed circuit board and a signal segment 138 appropriately connected to signal paths 132a and 132b to route signals from the signal paths 132a and 132b. The signal paths 132a, 132b may each be on different layers of a multi-layer printed circuit board.

As shown in FIG. 12B, the signal paths 132a, 132b can be routed using two MCVs 142a, 142b. Each of the MCVs includes a first and second signal segments 144, 148 and first and second ground segment 146, 150. Each of the ground segments 146, 150 is connected to the ground plane layer to provide a ground. The first signal segment 144 of MCV 142a is coupled to a pair of signal traces 132a, 132b to provide a first signal path through the first MCV 142a and the second signal segment 148 is connected to a pair of signal traces 132a, 132b to provide a second signal path through the MCV 142a.

Similarly, the first signal segment 144 of MCV 142b is coupled to a pair of signal traces 132a, 132b to provide a first signal path through the first MCV 142b and the second signal segment 148 is connected to a pair of signal traces 132a, 132b to provide a second signal path through the MCV 142b. It should be appreciated with such an arrangement, less vias need to be fabricated in the printed circuit board to provide a similar amount of signal paths, thus simplifying certain aspects of the manufacturing requirements and processes, and increasing the space for routing the layers.

Referring to FIG. 12C, a prior art PTH 130' is used to route a pair of signal path 152a entering the PTH 130' from a first direction and a second pair of signal paths 152b entering the PTH 130 from a second direction which is aligned with the first direction.

FIG. 12D shows a routing technique using two MCVs 134' to route signal paths 152a from one layer of the printed circuit board to another layer. In this embodiment, each of the MCVs 134' include a ground segment 136' which can be connected to a ground plane layer on the printed circuit board and a signal segment 138' appropriately connected to signal paths 152a and 152b to route signals from the signal paths 152a and 152b. The signal paths 152a, 152b may each be on different layers of a multi-layer printed circuit board.

As shown in FIG. 12E, the signal paths 152a, 152b can be routed using a single MCVs 142'. The MCV 142' includes first and second signal segments 144', 148' and first and second ground segment 146', 150'. Each of the ground segments 146', 150' are connected to a ground plane layer to provide a ground. The first signal segment 144' of MCV 142' is coupled to a pair of signal traces 152a, 152b to provide a first signal path through the MCV 142' and the second signal segment 148' is connected to a pair of signal traces 152a, 152b to provide a second signal path through the MCV 142'.

It should be appreciated with such an arrangement, fewer vias are required in the multilayer printed circuit board. Thus, the MCV reduces the number of vias required in a printed circuit board providing the same functionality of multiple PTHs and also while conserving valuable area on the printed circuit board, simplifying certain aspects of the manufacturing requirements (e.g. since fewer plated through holes are required) and processes and allowing increases in connection density of the printed circuit board. It should, however, be noted that splitting the via is an added step which may result in somewhat increased complexity in the manufacture of the PCB. In addition high speed performance characteristics are not attainable with conventional vias.

Figure 13:
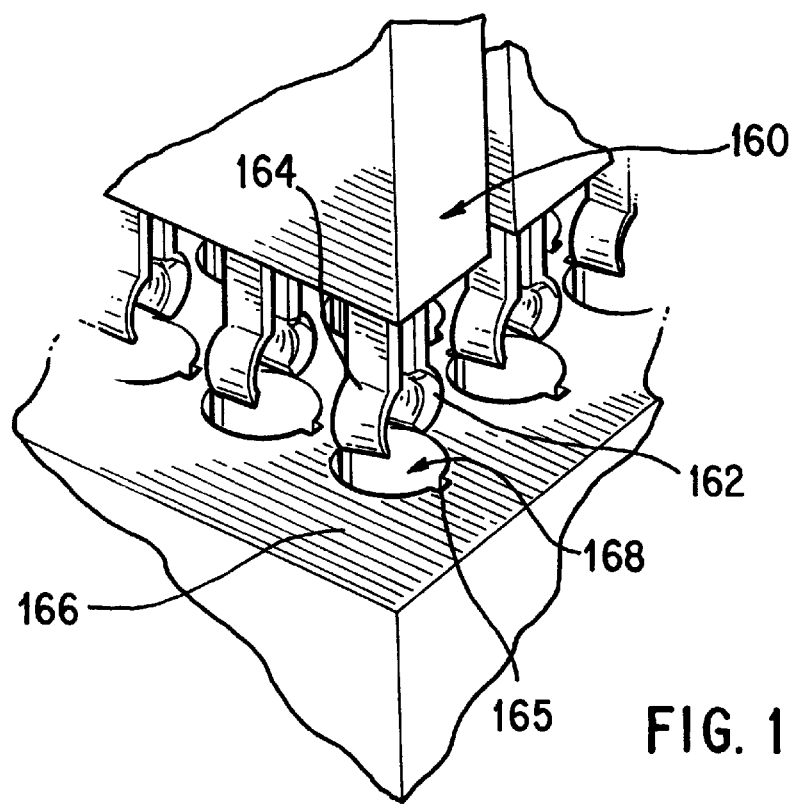
FIG. 13 is a perspective view of a connector having a plurality of contact pairs press fit into a multi-connection via.
Figure 13A:
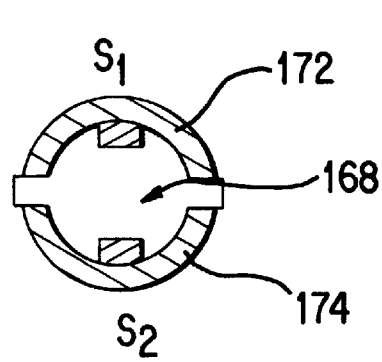
FIG. 13A is a cross-sectional view of a differential connection in a multi-connection via.
Figure 13B:
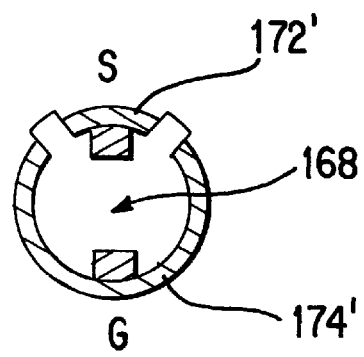
FIG. 13B is a cross-sectional view of a single-ended connection in a multi-connection via.

Referring now to FIGS. 13, 13A and 13B, having described various embodiments of a via with multiple conductors, it should now be appreciated, an improved multi-connection connector 160 including a first contact 162 and a second contact 164 can be provided to mate with a plated through hole or via 168 disposed within a printed circuit board 166, the via 168 having a first separate electrically segment 172 which mates with contact 162 and a second separate electrically isolated segment 174 which mates with contact 164. As shown in FIG. 13A, the via 168 can be arranged in a differential pair to provide two signal paths with segment 172 providing the first signal path and segment 174 providing the second signal path. Alternatively, as shown in FIG. 13B, the via 168 can be arranged with a signal segment 172' and a ground segment 174' to provide a single signal path. In this embodiment, contacts 162 and 164 press fit into the via 168 to provide connectivity between the connector 160 and the printed circuit board 166 as shown.

Figure 13C:
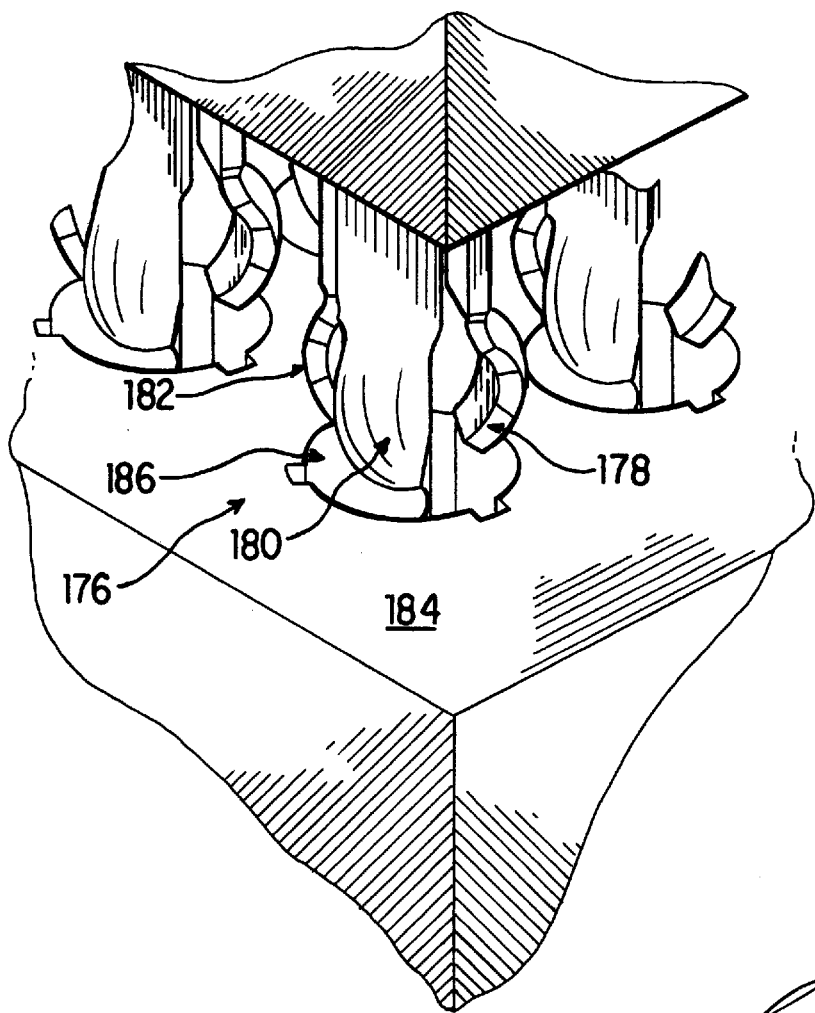
FIG. 13C is a perspective view of a connector having a triplet contacts press fit into a multi-connection via.
Figure 13D:
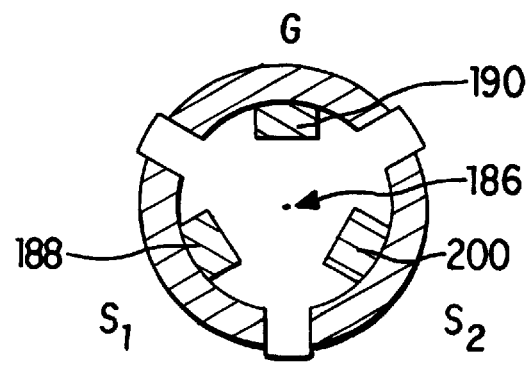
FIG. 13D is a cross-sectional view of a differential connection in a multi-connection via.

For differential connections, it is desirable to have a ground structure close to the differential pair. Usually referred to as a drain, this ground structure provides return to stray signals due to imperfections in the differential pair. FIGS. 13C and 13D shows an embodiment with connector elements that provide three connections required for a good differential pair. A pressfit connector 176 includes a first signal contact 178, a second signal contact 182 and a ground contact 180 that will mate with a plated through hole or via 186 disposed within a printed circuit board 184. The via 186 includes a first signal segment 188 which mates with contact 178, a second signal segment 200 which mates with contact 182 and a ground segment 190 which mates with ground contact 180. The latter arrangement provides a ground path is close proximity to the signal path. A pressfit connection is shown but a soldered-in connector could also be used.

Figure 14:
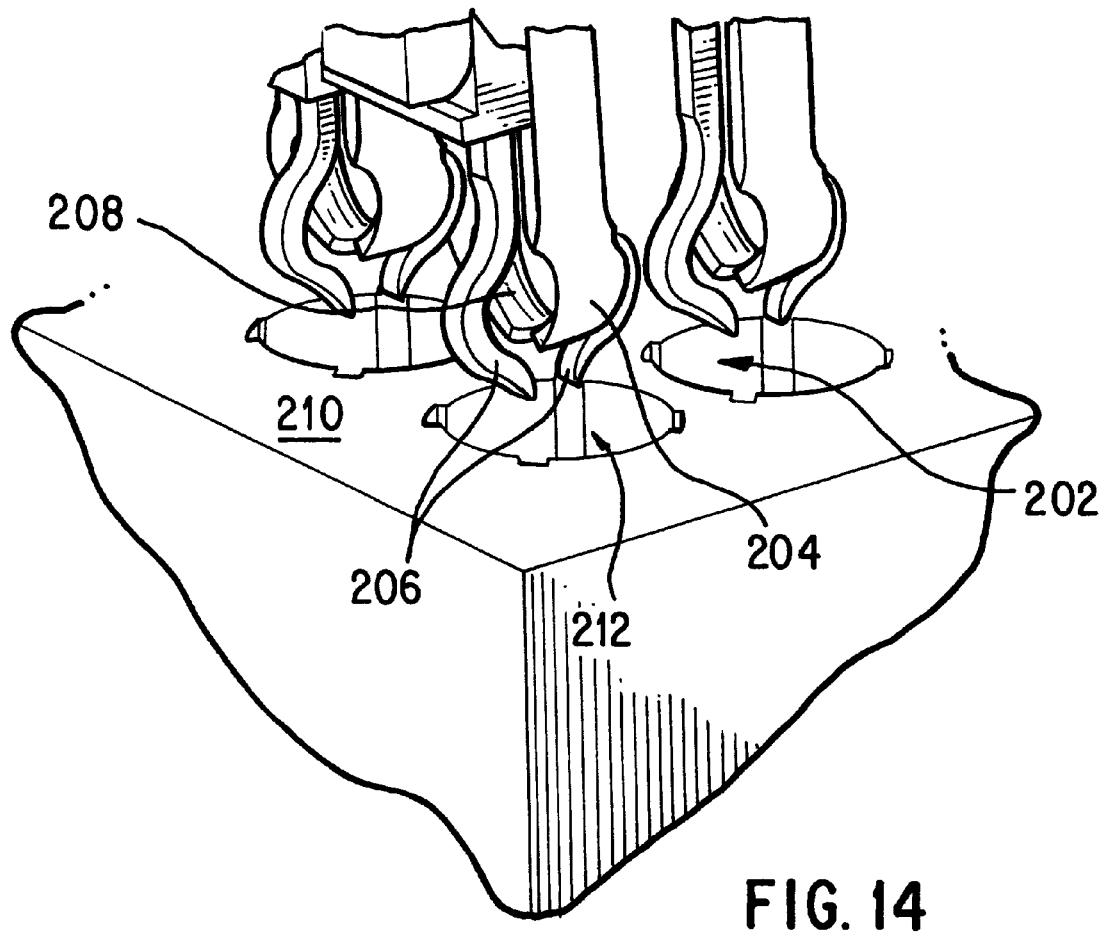
FIG. 14 is a perspective view of a connector having a pair of signal contacts and a pair of ground contacts press fit into a multi-connection via.
Figure 14A:
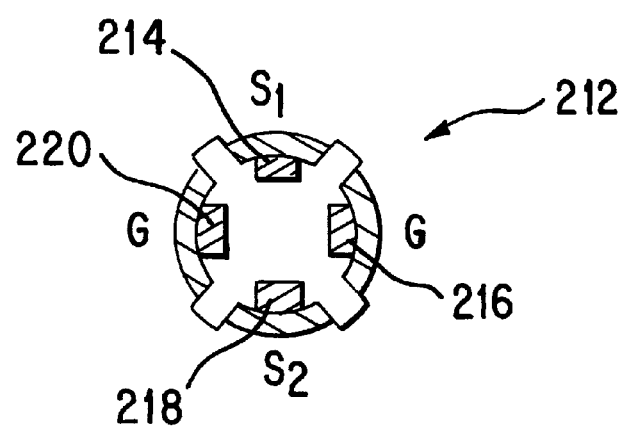
FIG. 14A is a cross-sectional view of the connector of FIG. 14 after insertion into the multi-connection via.

Referring now to FIGS. 14 and 14A, scaling the number of connections to four per via provides for two single-ended signals and two ground segments separating them. In this embodiment, a connector 202 includes a first signal contact 204 and a second signal contact 208 and a pair of ground contacts 204. A via 212 disposed in the printed circuit board 210 includes a first signal segment 214 which mates with contact 204, a second signal segment 218 which mates with contact 208 and a first and second ground segment 216, 220. The pair of ground contacts 204 makes connections to the two opposite segments 216, 220 of the via 212 separating the two signal paths.

Figure 15:
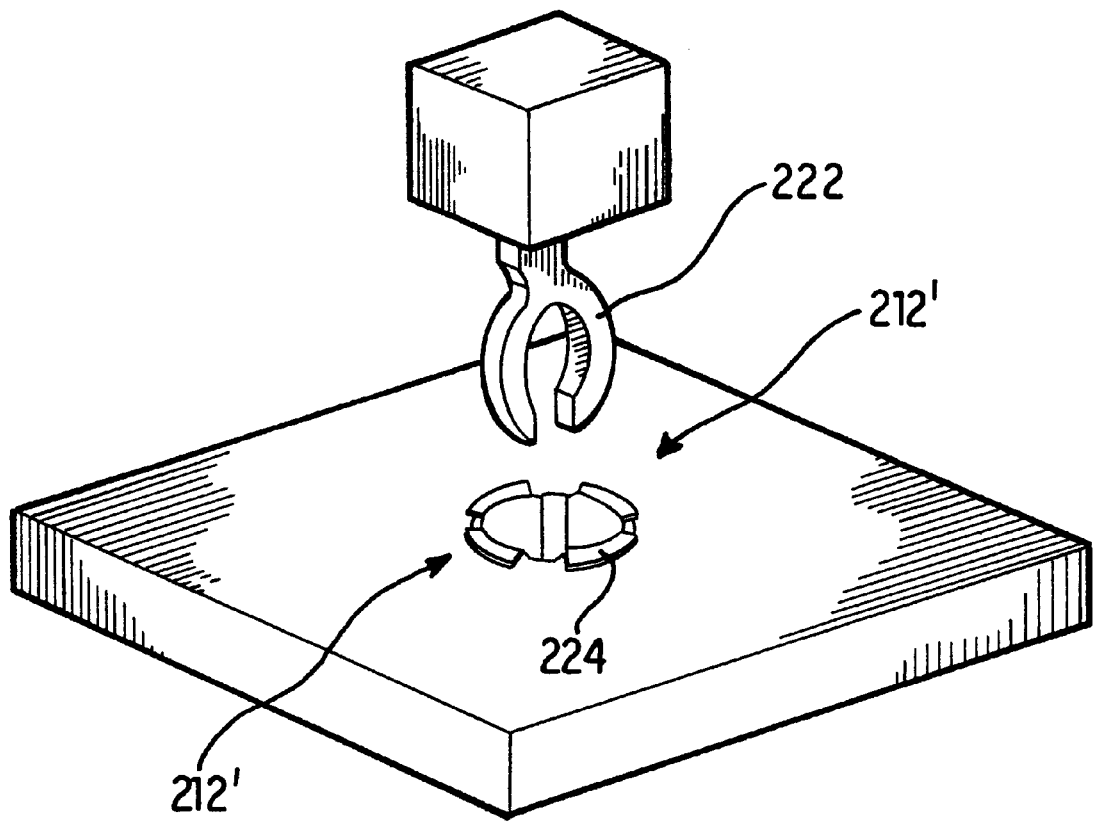
FIG. 15 is a perspective view of a connector having an eye of the needle connector disposed above a multi-connection via.
Figure 15A:
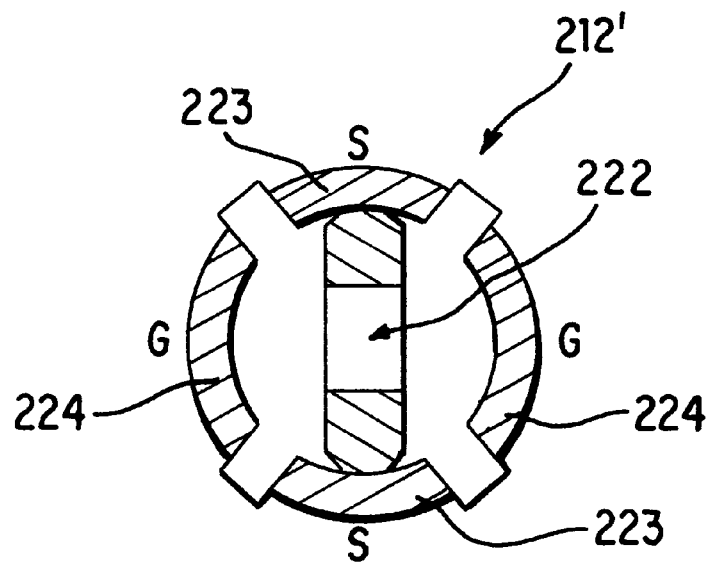
FIG. 15A is a cross-sectional view of the connector of FIG. 15 after insertion into the multi-connection via.

FIGS. 15 and 15A show a variation of this configuration using known connector types, namely eye-of-the-needle pressfit contact 222 and pressure-mount pads 224, with a multi-connection via 212'. The pressfit contact 222 is press fit against segment 223 which provides the required retention force. It should be noted that the architecture shown in FIGS. 15, 15A illustrate a so-called "shielded via" concept which can be applied to existing products, with minor PCB routing redesign.

Figure 16:
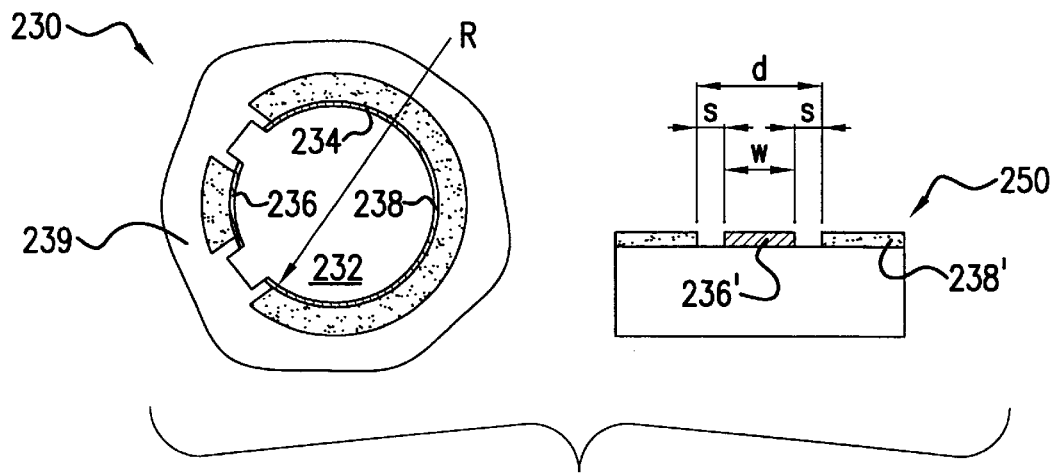
FIG. 16 is a cross-sectional view of a single-ended co-cylindrical waveguide.

Referring now to FIG. 16, a co-cylindrical waveguide 230 is shown having a similar structure as a co-planer waveguide 250. In the co-cylindrical waveguide 230, an interior wall 234 of a plated hole 232 which is a cylinder includes both a ground conductor 238 and a signal conductor 236. As in a co-planer waveguide 250 having a signal conductor 236' and a ground conductor 238', a signal propagates along the co-cylindrical waveguide 1681 between the signal conductor 236 and the adjacent ground conductor 238.

A co-cylindrical waveguide provides a similar structure and maintains impedance control between signal and ground segments in a way analogous to a co-planar waveguide. Impedance matching is controlled by controlling diameter of the signal segment and signal arch length and gap relative to the ground segment and ground plane clearances. A typical embodiment often results in a small signal segment relative to the ground segment. When appropriate, the ground segment can be divided into more than one segment without performance degradation. In the case of one signal segment and one ground segment, the ground segment is typically, but not always, greater than 180 degrees.

Figure 17:
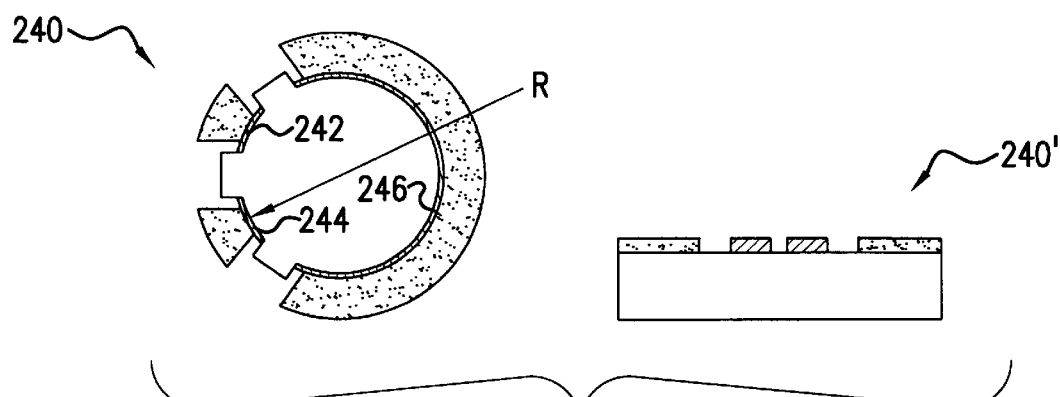
FIG. 17 is a is a cross-sectional view of a differential co-cylindrical waveguide.

Referring to FIG. 17, a differential via structure, here a co-cylindrical waveguide 240 having two signal segments 242, 244 among the ground segment 246 and typically the signal segments 242, 244 are much narrower than the ground segment 246. The impedance is matched by controlling diameter, signal segment arch lengths, gap spacing between signal segments, signal segment gap spacing relative to a ground segment and ground plane clearances. By providing separate signal segments 242, 244 and ground segment 246, a differential signal can be transmitted in a single via. Again, the differential co-cylindrical waveguide 240 has similar characteristics to a differential co-planar waveguide 240'. It should be noted that during the manufacturing process the ends of the glass fibers of the printed circuit board 239 may be exposed during the process to split the via into multiple segments. The via can be filled with a dielectric material (such as epoxy) to seal the ends of the glass fibers thereby preventing the fibers from absorbing moisture which could affect the performance of circuits disposed on the PCB and also reduce the structural integrity of the PCB.

Referring again to FIG. 16, it should be appreciated, the impedance, Z, of the co-cylindrical waveguide is a function of $Z=f(d_f, T_p, T_w, X_g, \epsilon_{r,board}, \epsilon_{r,via})$, where: $d_f$=finished diameter, $T_p$=plating thickness, $T_w$=the gap, $X_g$=clearance in the ground plane, $X_p$=ground plane spacing, $\epsilon_{r,board}$=dielectric constant of the PCB, and $E_{r,board}$=dielectric constant inside the via. When the via diameter is very large, co-planer waveguide modeling provides a good approximation of the characteristics of a co-cylindrical waveguide until further models are developed exclusively for co-cylindrical waveguides. It should be noted that impedance values can be found using a variety of numerical techniques including but not limited to finite element techniques. The simplest co-planer waveguide case is the single-ended, infinite wide ground-conductor, and infinite thick substrate case, as depicted in FIG. 16, which also approximates the large diameter co-cylindrical waveguide, because the grounds connect together and the substrate is in the plane of the board making it very thick. The general approach to this analysis is to use a conformal imaging method as described below. The complete first order elliptical integral (K(k)) of the modulus w/d (equals k) as:

$$Z_L = \frac{Z_{LO}}{\sqrt{\varepsilon_{r,eff}}} = \frac{\eta_0 K\left(\sqrt{1-k^2}\right)}{4\sqrt{\varepsilon_{r,eff}} \cdot K(k)} \quad \text{Eq. D1}$$

In this case the thickness, t, is considered to be infinitely thin. $\eta_0$ is the permeability of free space (120 π). The dielectric constant is averaged between the substrate and the air, yielding an effective dielectric constant:

$$\varepsilon_{r,eff} = \frac{(\varepsilon_r + 1)}{2} \quad \text{Eq. D2}$$

By dividing the bounds, the formulation can be fit into two, more useful cases. The first case is when $0 < w/d \leq 0.173$ or $\eta_0 \leq Z_{LO} < \infty$:

$$Z_{LO} = \frac{\eta_0}{2} \ln\left(2\sqrt{\frac{d}{w}}\right) \quad \text{Eq. D3}$$

Solving for modulus gives:

$$\frac{w}{d} = 4e^{-2Z_{LO}\frac{\eta_0}{\pi}} \quad \text{Eq. D4}$$

And for $0.173 \leq w/d \leq 1$ or $0 < Z_{LO} \leq \eta_0/2$:

$$Z_{LO} = \frac{\pi\eta_0}{4}\left[\ln(2) + 2\tanh^{-1}\left(\sqrt{\frac{w}{d}}\right)\right]^{-1} \quad \text{Eq. D5}$$

Solving for modulus yields:

$$\frac{w}{d} = \left[\tanh\left(\frac{\pi\eta_0}{8Z_{LO}} - \frac{\ln(2)}{2}\right)\right]^2 \quad \text{Eq. D6}$$

From the latter, the parameters of a co-cylindrical waveguide can be approximated.

It should now be appreciated that a signal can be transmitted on the signal segment 236 and the signal will propagate along the co-cylindrical waveguide as a signal propagate along a co-planar waveguide.

Figure 18:
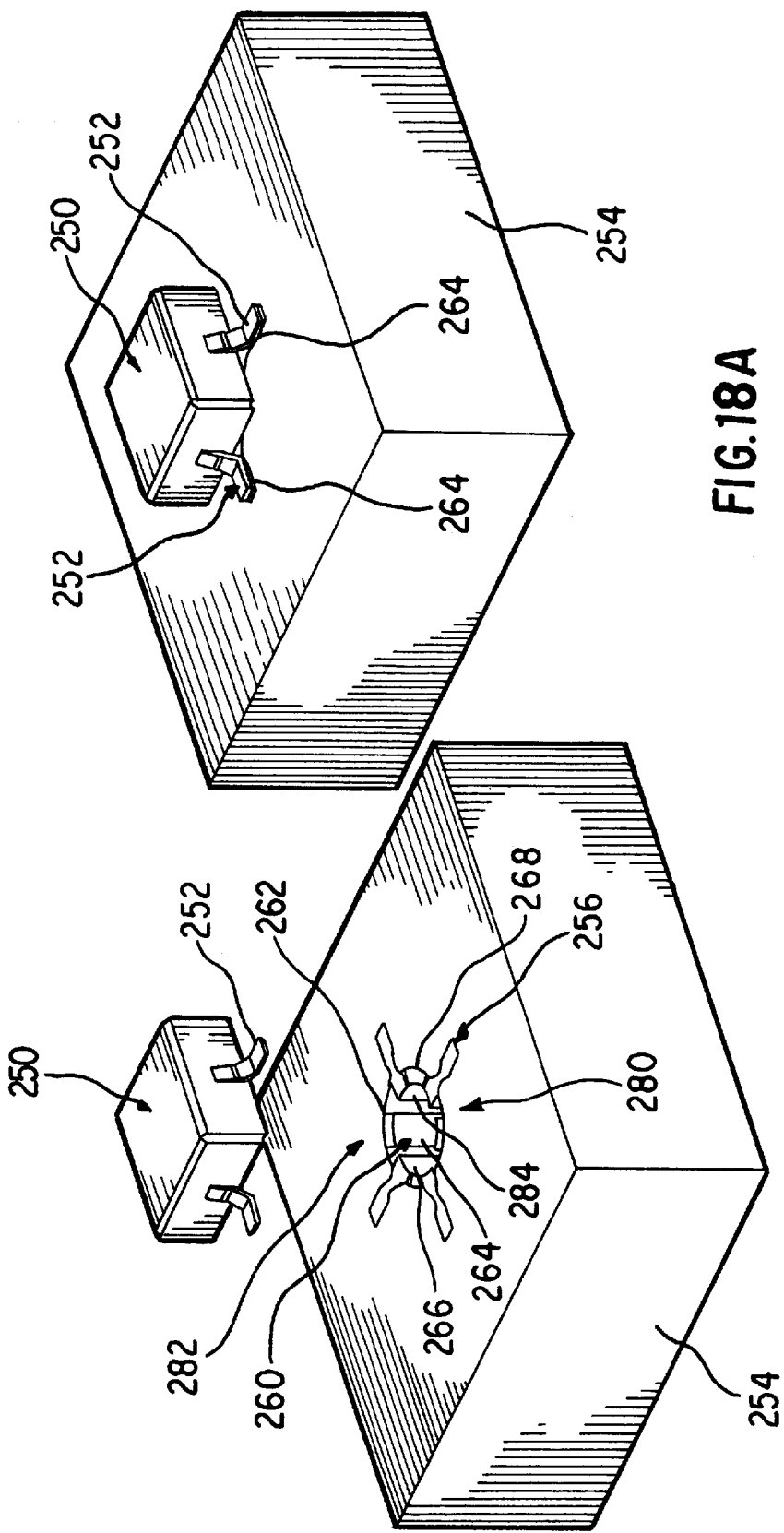

Referring now to FIGS. 18A and 18B, having described various embodiments of a via with multiple segments or conductors, it should now be appreciated, an improved multi-connection connector 280 including a plated through hole 282 having at least a first and a second separate electrically isolated segment 262 can be provided with a first surface mount technology contact or pad 256 connected to the first separate electrically isolated segment 262 and a second surface mount technology contact or pad 268 connected to the second separate electrically isolated segment 262.

A surface mount device 250 is shown with a plurality of surface mount technology (SMT) contacts 252. A printed circuit board (PCB) 254 includes a multi-connection via (MCV) 260, here including eight separate segments 262, where the surface mount device 250 is mounted. First ones of the segments 262 correspond to ground segments 264 and second ones of the segments 262 correspond to signal segments 266. A plurality of SMT pads 256 are disposed on the printed circuit board 254 and are coupled to predetermined ones of the signal and ground segments 264, 266 of the MCV 260. The pads 256 are arranged in a pattern which is selected such that when the device 250 is disposed on the PCB 254, the pads 256 are aligned to receive corresponding ones of the SMT contacts 252.

Depending upon the particular device 250, all of the contacts 252 can correspond to signal contacts, or all of the contacts can correspond to ground contacts or first ones of the contacts 252 can correspond to signal contacts of the device 250 while second ones of the contacts 252 can correspond to ground contacts of the device 250. The device 250 is oriented with respect to the MCV 260 such that device ground contacts 252 (if any) are coupled to the MCV signal segments 264 and device signal contacts 252 (if any) are coupled to the MCV ground segments 266. Thus the pads 256, are coupled to signal or ground segments of MCV 260 depending upon the function of the device contact which will be coupled thereto. The function of each pad is of course known prior to the manufacture of the PCB in which the MCV 260 exists.

With such an arrangement, a multi-connection connector 280 is provided with a multi-connection via configured as a co-cylindrical waveguide having a similar structure as a co-planner planer waveguide. In a co-cylindrical waveguide, the interior wall 284 of a plated hole 282 which is a cylinder includes both the ground conductors 264 and the signal conductors 266. As in a co-planer waveguide, the signal propagates along between the signal conductor 266 and the adjacent ground conductor 264.

A co-cylindrical waveguide provides a similar structure and maintains impedance control between signal and ground segments in a way analogous to a co-planar waveguide. Impedance matching is controlled by controlling diameter of the signal segment and signal arch length and gap relative to the ground segment and ground plane clearances. A typical embodiment often results in a small signal segment relative to the ground segment. When appropriate, the ground segment can be divided into more than one segment without performance degradation. In the case of one signal segment and one ground segment, the ground segment is typically, but not always, greater than 180 degrees. A differential via structure incorporates two signal segments among the ground segment and typically the signal segment is much narrower than the ground segment. The impedance is matched by controlling diameter, signal segment arch lengths, gap spacing between signal segments, signal segment gap spacing relative to a ground segment and ground plane clearances. By separating signal segments 266 with ground segments 264, multiple signals can be transmitted in a single via. It should be noted that during the manufacturing process the ends of the glass fibers of the printed circuit board 254 may be exposed. The via can be filled with a dielectric material (such as epoxy) to seal the ends of the glass fibers.

It should now be appreciated a different signal can be transmitted on each one of the signal segments 266 and that the surface mount device 250 can be disposed on the printed circuit board 254 with connector 280 utilizing much less surface of the printed circuit board 254 as needed when using known vias.

Figure 19:
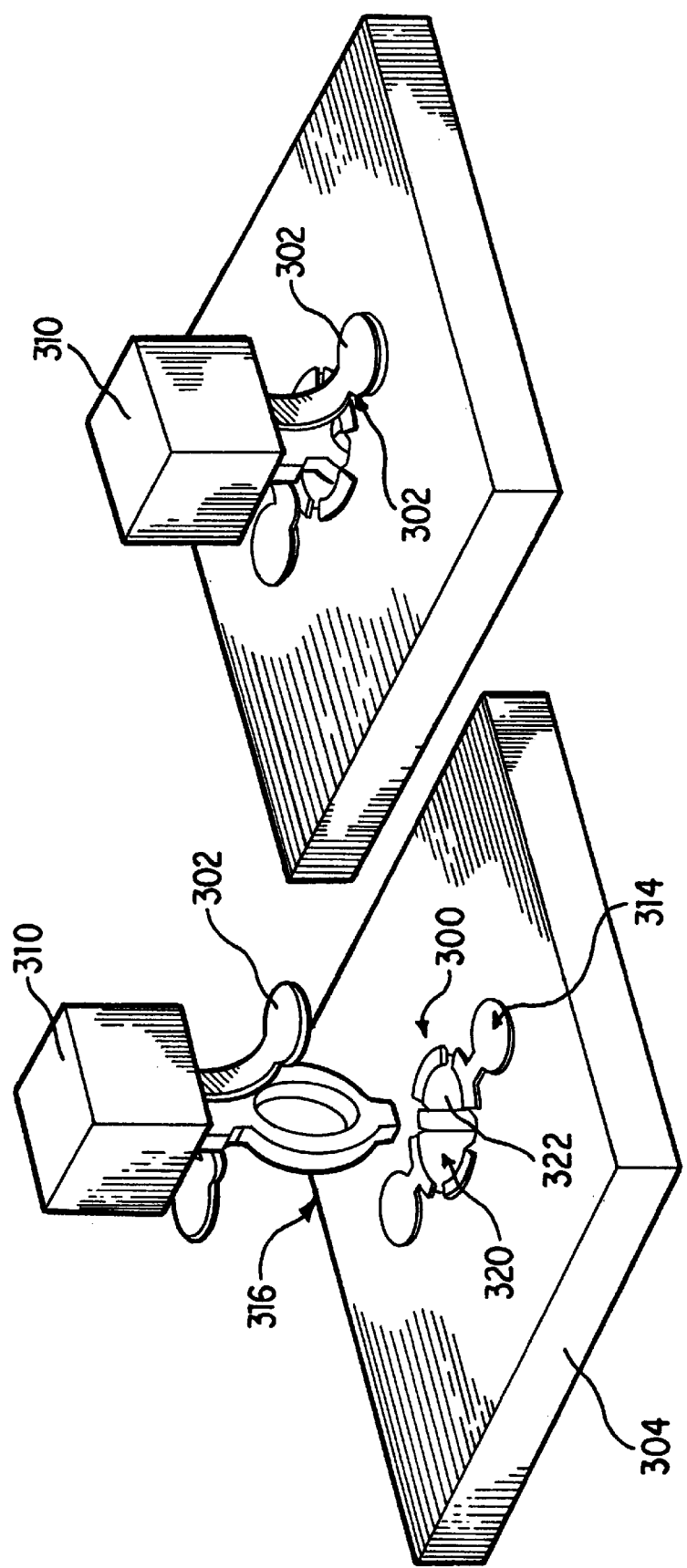

Referring now to FIGS. 19 and 19A, a pressfit and SMT hybrid connector 300 is shown. A surface mount device 310 is shown with a plurality, here two, of surface mount technology (SMT) contacts 302. A printed circuit board 304 includes a multi-connection via 320, here including four separate segments 322, where the surface mount device 310 is mounted. A plurality, here two, of SMT pads 314 are disposed on the printed circuit board 304 as shown to receive corresponding ones of the SMT contacts 302. A pressfit contact 316 is disposed between the SMT contacts 302 as shown. Here, the pressfit contact 316 provides a ground conductor as well as the required retention force and the SMT contacts 302 provide signal conductors. With such an arrangement, the connector 300 provides a signal path for two signals.

Figure 20:
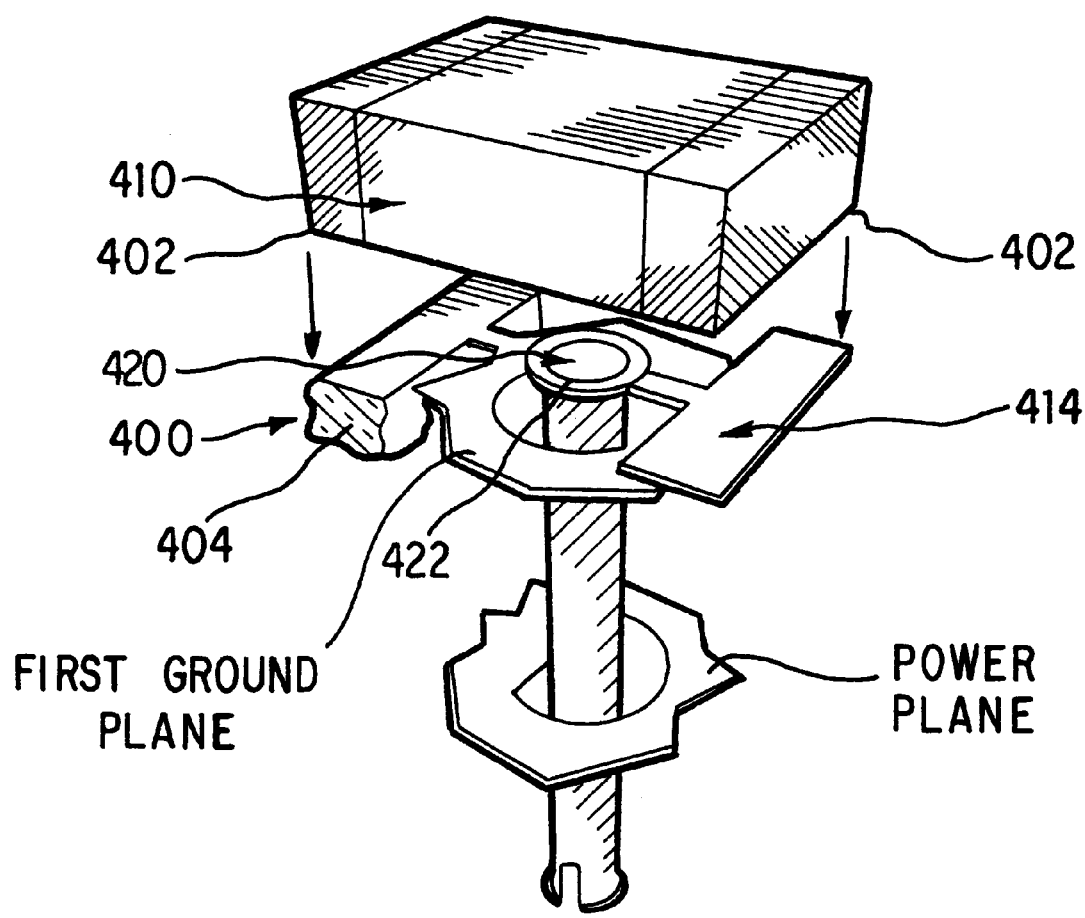
FIG. 20 is a perspective view of a surface mount capacitor disposed over a multi-connection via.

Referring now to FIG. 20, a SMT connector 400 is shown. An SMT by-pass capacitor 410 is shown with two SMT contacts 402. A printed circuit board 404 includes a multi-connection via 420, here including two separate segments 422. Two SMT pads 414 are disposed on the printed circuit board 404 as shown to receive corresponding ones of the SMT contacts 402. Here, one of the separate segments 422 provides a ground conductor and the other one of the separate segments 422 provides a signal conductor or here a power conductor. With such an arrangement, the connector 400 provides a signal path to connect the SMT by-pass capacitor 410 to the printed circuit board 404. In a typical SMT by-pass capacitor, the lead length from the power and ground planes determines the lead inductance. The shorter the lead, the lower the inductance will be, and consequently, the higher the . frequency of operation. Utilizing a multi-connection via connector does not change the design of the SMT package of the by-pass capacitor, but takes advantage of the new via geometry for routing only. Placing the via directly below the SMT by-pass capacitor 402, as shown in FIG. 20, reduces the inductance loop to only the surface trace. Because the via itself offers an impedance-controlled structure, the inductance caused by a conventional via configuration does not apply. The offers a superior solution than using micro-vias because power planes most often are located in the middle of the printed wiring board, where micro vias cannot easily reach.

Figure 21:
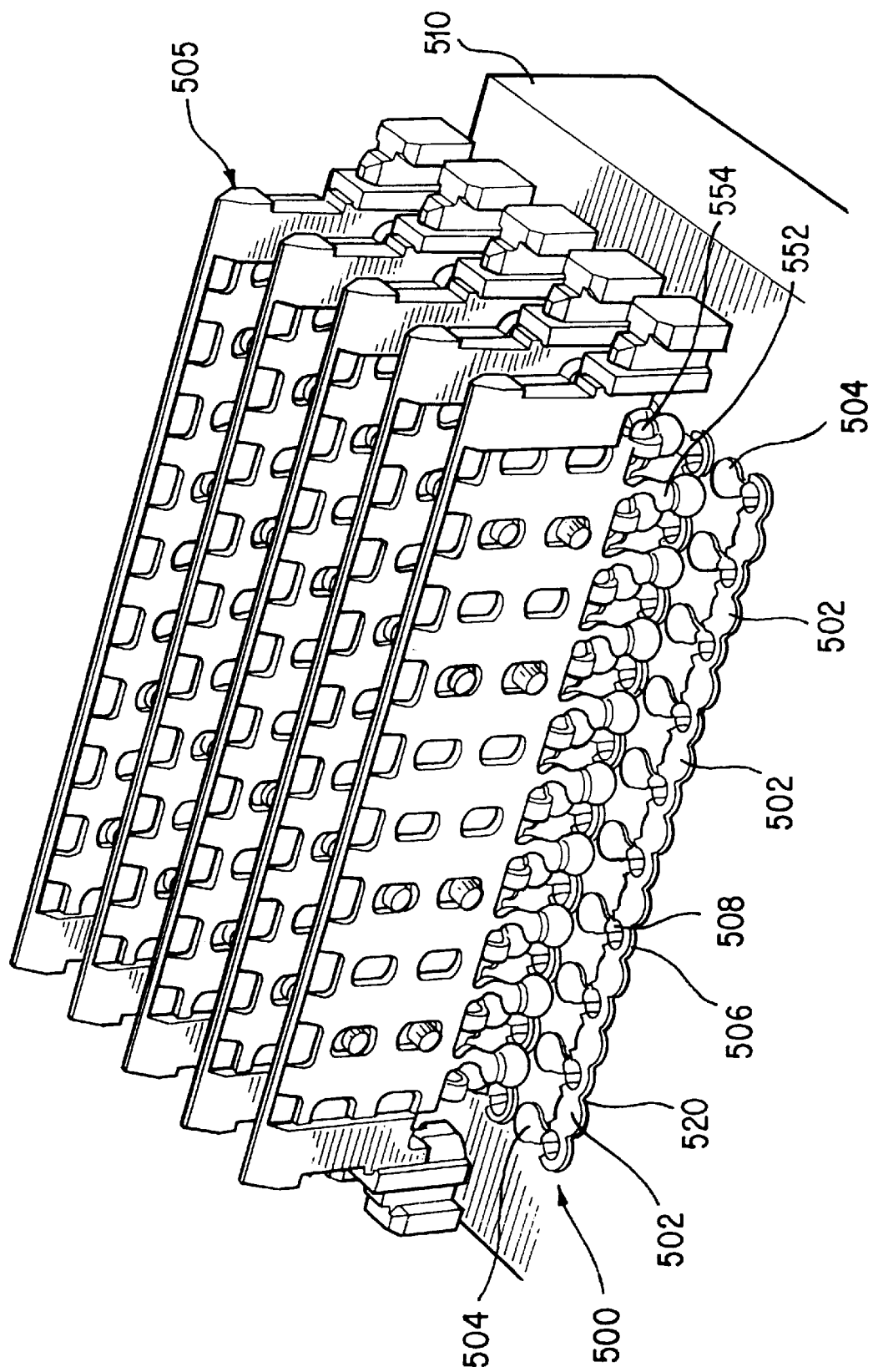
FIG. 21 is a perspective view of surface mount connector coupled to surface mount pads of multi-connection vias provided in a multi-layer printed circuit board.
Figure 21A:
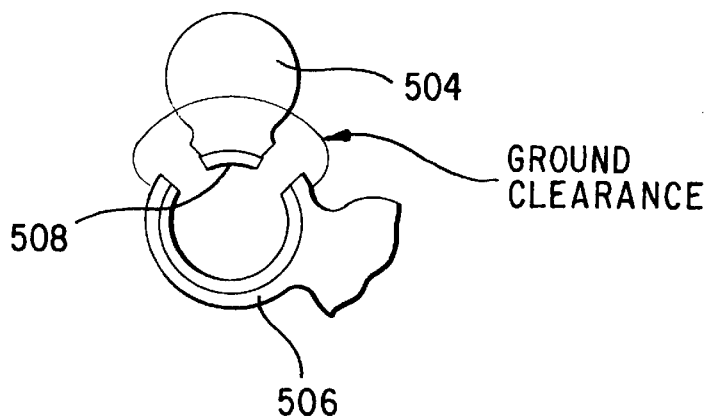
FIG. 21A is a top view of a multi-connection via provided in the second printed circuit board shown in FIG. 21.

Referring now to FIGS. 21 and 21A, a printed circuit board 510 is shown to include a plurality of SMT connectors 500 each having a multi-connection via 520 adapted to connect to a daughter board connector, represented here as a collection of SMT wafers 505. It should be appreciated that although MCV 520 is here shown providing connections to a plurality of SMT daughter board wafers, those of ordinary skill in the art will recognize that MCVs 520 may be used to couple any type of PCBs.

Each one of the SMT connectors 500 include an SMT pad 502 to provide a ground connection and an SMT pad 504 to provide a signal connection. In a similar manner as described earlier, the multi-connection via 520 includes a ground segment 506 to provide a ground conductor connected to a corresponding SMT pad 502 and a signal segment 508 to provide a signal conductor connected to a corresponding SMT pad 504. Each of the SMT pads 502 are connected together with the ground segments 506 as shown.

For each one of the SMT pads 502, an SMT contact 552 is located on the daughter board connector wafer 505 to mate with a corresponding SMT pad 502 as shown to provide a ground connection between the daughter board 505 and the printed circuit board 510. For each one of the SMT pads 504, an SMT contact 554 is located on the daughter board connector wafer 505 to mate with a corresponding SMT pad 504 as shown to provide a signal connection between the daughter board connector wafer 505 and the printed circuit board 510. It should now be appreciated with such an arrangement, when using the SMT connectors 500, fewer vias are required on the printed circuit board 510 to provide a similar number of connections between the daughter board 505 and the printed circuit board 510. The latter provides better routability of signal paths between the daughter boards 505 and the printed circuit board 510. Such an arrangement also provides better signal integrity for high speed circuits i.e. less cross talk, eliminates reflections, reduced attenuation and in general provides better impedance control of the signal path between the daughter board connector wafer 505 and the printed circuit board 510. It should also be appreciated that more connections between the daughter board connectors 505 and the printed circuit board 510 can be made with the SMT connectors 500 within the same amount of space than when using known via structures (assuming that microvias are not being considered).

Figure 22A:
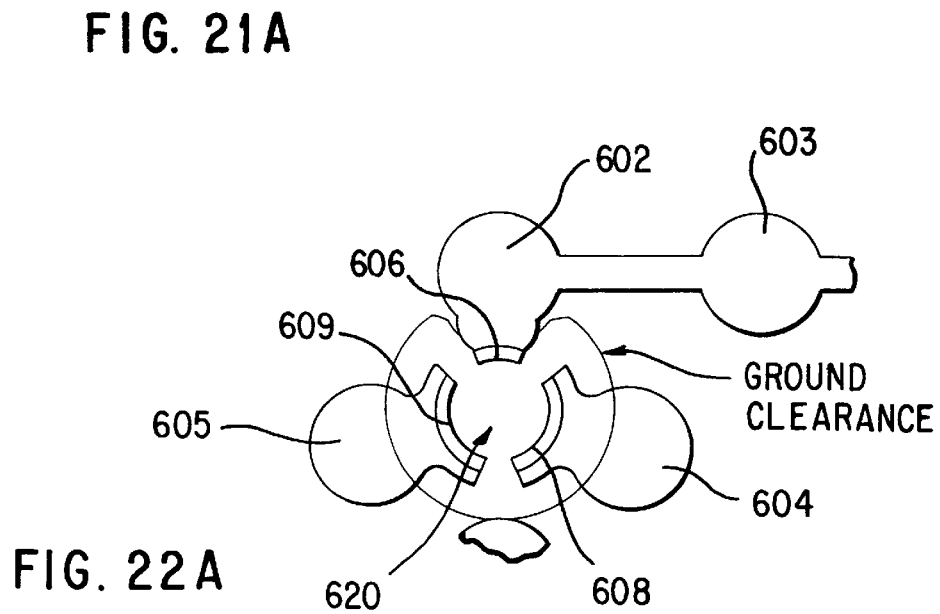
FIG. 22A is a top view of a multi-connection via provided in the second printed circuit board shown in FIG. 21.
Figure 22:
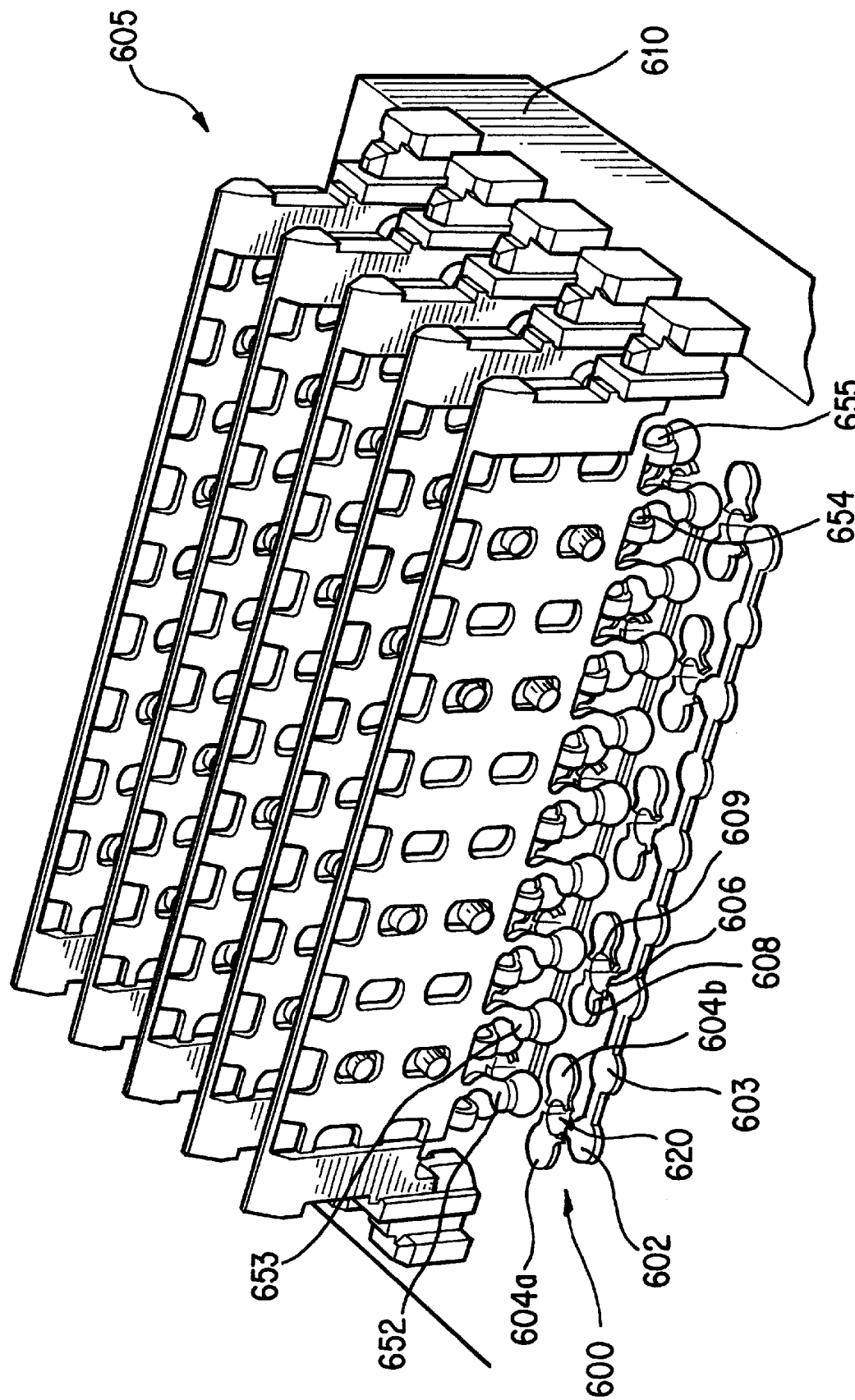
FIG. 22 is a perspective view of a first printed circuit board having surface mount connectors coupled to multi-connection vias on a second printed circuit board.

Referring now to FIGS. 22 and 22A, a printed circuit board 610 is shown to include a plurality of SMT connectors 600 each having a differential multi-connection via 620 for connecting a daughter board connector, represented here as a collection of SMT wafers 605. It should be noted that connectors shown in FIG. 22 are also described in co-pending application Ser. No. 09/198,442 assigned to the assignee of the present invention and incorporated herein by reference.

It should be noted that although daughter board connectors are here shown, any type of connector a could also be used. Each one of the SMT connectors 600 include an SMT pad 602 to provide a ground connection and SMT pads 604a and 604b to provide a differential signal connection.

The multi-connection via 620 includes a ground segment 606 to provide a ground conductor connected to a corresponding SMT pad 602, a signal segments 608 and 609 to provide a differential signal conductor connected to corresponding SMT pads 604a and 604b. Each of the SMT pads 602 are connected together with the ground segments 606 with other SMT pads 603 disposed between the SMT pads 602 as shown.

The multi-connection via 620 includes two signal conductors providing differential signal path for corresponding signal. For each one of the SMT pads 602, an SMT contact 652 is located on the daughter board connector wafer 605 to mate with a corresponding SMT pad 602 as shown to provide a ground connection between the daughter board connector wafer 605 and the printed circuit board 610. Additionally, an SMT contact 653 located on the daughter board connector wafer 605 provides a ground connection between the daughter board and the printed circuit board 610 mating with SMT pads 603. For each one of the SMT pads 604a, an SMT contact 654 is located on the daughter board connector wafer 605 to mate with a corresponding SMT pad 604a as shown to provide a signal connection between the daughter board connector wafer 605 and the printed circuit board 610. For each one of the SMT pads 604b, an SMT contact 655 is located on the daughter board connector wafer 605 to mate with a corresponding SMT pad 604b as shown to provide a signal connection between the daughter board 605 and the printed circuit board 610.

It should now be appreciated with such an arrangement, when using the SMT connectors 600, fewer vias are required on the printed circuit board 610 to provide a similar number of connections between the daughter board 605 and the printed circuit board 610. The latter provides better routability of signal paths between the daughter boards connector wafer 605 and the printed circuit board 510 as well as routability between rows, which is not possible with conventional vias. It should also be appreciated that conventional via structures do not provide a true differential connection between layers in the PCB, thus this arrangement provides a superior performing connection from the daughter card connector to the layer trace.

Figure 23:
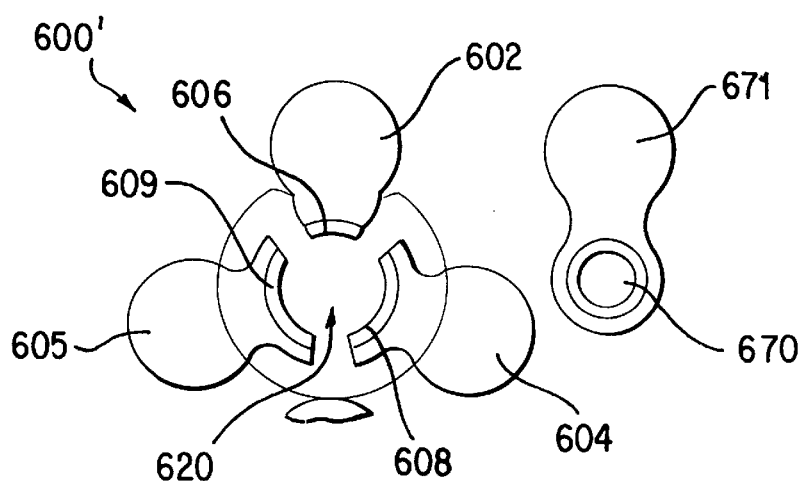
FIG. 23 is a top view of a multi-connection via provided in a printed circuit board.

Referring now to FIG. 23, an alternative embodiment of printed circuit board 610 is shown to include a plurality of SMT connectors 600' each having a multi-connection via 620 provided in the printed circuit board 610. In the alternative embodiment, an additional via 670 connected to a pad 671 is included to provide a ground connection and replacing the surface traces of the previous embodiment. It should be noted that the embodiment of FIG. 23 is similar to the same differential configuration as the embodiments of FIGS. 21–22 but instead of a surface trace connecting the additional ground pin (specific to the connector illustrated) a separate conventional ground via is used.

In present vias, the metal plating of the via acts to seal the cut drilled surface of the via. In fabricating multi-connection vias, drilling exposes cut ends of the glass fiber of the printed wiring board, allowing the printed circuit board to absorb moisture and other chemicals. Cutting the plating to form a split via exposes the fibers again. In all of the embodiments showing a multi-connection via, the via can be filled with a dielectric material (such as epoxy) to seal the ends of the glass fibers exposed between the conducting material. For pressfit contacts a soft gel seal can be used which will push out of the way of the connector as it is pressed into the hole to seal the ends of the glass fibers exposed between the conducting material.

It should now be appreciated that various connectors can be contemplated, for example, referring now to FIGS. 2–3E any one of the multi-connection vias shown could be adapted to provide an appropriate multi-connection connector.

It should be appreciated that multi-connection vias, described herein, provide a structure and method for matching the impedance of vertical and in-plane features by forming co-cylindrical waveguides. Solutions from a high-frequency full-wave solver provide insight into field interactions within multi-connection vias; and results from these simulations and signal integrity experiments indicate impedance "tuneability" by adjusting the multi-connection via dimensions. The results also suggest that features can be impedance-matched independent of via diameter.

All references cited herein are hereby incorporated by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A circuit comprising:
   (a) a multi-layer structure;
   (b) a multi-connection via disposed in said multi-layer structure, said multi-connection via provided from a single hole having at least first and second separate electrically isolated segments within the hole with the first segment having a first predetermined width and the second segment having a second predetermined width; and (c) a circuit component having a plurality of surface mount contacts, with a first one of the plurality of surface mount contacts disposed on at least a portion of the first segment of said multi-connection via and a second one of the plurality of surface mount contacts disposed on at least a portion of the second segment of said multi-connection via and wherein the widths of each of the first and second segments of said multi-connection via are selected such that said multi-connection via provides a predetermined impedance characteristic to said circuit component.

2. The circuit of claim 1 wherein the first segment of said multi-connection via is coupled to a ground layer of said multi-layer structure and the second segment of said multi-connection via is coupled to a first signal trace disposed on a first signal layer of said multi-layer structure.

3. The circuit of claim 2 wherein the second segment of said multi-connection via is coupled to a second signal trace disposed on a second different signal layer of said multi-layer structure and wherein said first and second signal traces are electrically coupled through the second segment of said multi-connection via.

4. The circuit of claim 2 wherein the second segment of said multi- connection via corresponds to a first signal segment of said multi-connection via and is a first one of a plurality of electrically isolated signal segments, each of the plurality of electrically isolated signal segments coupled to a corresponding one of a like plurality of signal traces, with at least some of said plurality of signal traces disposed on different signal layers of said multi-layer structure.

5. The circuit of claim 1 wherein the first and second segments of said multi-connection via correspond to signal segments and are coupled to a first pair of differential signal traces disposed on a first layer of said multi-layered structure.

6. The circuit of claim 5 further comprising a second pair of differential signal traces disposed on a second different layer of said multi-layer structure, said second pair of differential signal traces coupled to the first and second segments of said multi-connection via such that said first and second pairs of differential signal traces are electrically coupled through said multi-connection via.

7. The circuit of claim 6 wherein said multi-connection via further comprises at least one segment coupled to a ground layer of said multi-connection via.

8. The circuit of claim 1 wherein said circuit component further comprises an eye-of-the needle contact having a shape adapted to fit within an opening defined by the surfaces of said at least first and second segments of said multi-connection via such that at least a portion of the eye-of-the-needle contact is disposed against a surface of at least one of said first and second segments of said multi-connection via.

9. The circuit of claim 8 wherein the eye-of-the needle contact is provided having a shape which is adapted to provide a pressfit in the opening defined by the surfaces of said at least first and second segments of said multi-connection via.

10. A circuit comprising:

(a) a multi-layer structure;

(b) a multi-connection via disposed in said multi-layer structure, said multi-connection via provided from a single hole having at least first and second separate electrically isolated segments within the single hole with the first segment having a first predetermined width and the second segment having a second predetermined width to provide said multi-connection via having a predetermined impedance characteristic and an opening defined by surfaces of said at least first and second segments of said multi-connection via; and (c) a circuit component having an eye-of-the needle contact having a shape adapted to fit within the opening defined by the surfaces of said at least first and second segments of said multi-connection via such that at least a portion of the eye-of-the-needle contact is disposed against a surface of at least one of said first and second segments of said multi-connection via.

11. The circuit of claim 10 wherein the first segment of said multi-connection via is coupled to a ground layer of said multi-layer structure and the second segment of said multi-connection via is coupled to a first signal trace disposed on a first signal layer of said multi-layer structure.

12. The circuit of claim 11 wherein the dimensions of the opening defined by the surfaces of said at least first and second segments of said multi-connection via and the dimensions of the eye-of-the-needle contact are selected such that eye-of-the-needle contact is pressfit in the opening.

13. The circuit of claim 11 further comprising a plurality of surface mount pads disposed on the multi-layer structure with each of said plurality of surface mount pads coupled to a corresponding one of the at least first and second segments of said multi-connection via and wherein:

said circuit component has a plurality of surface mount contacts; and said plurality of surface mount pads are arranged to receive corresponding ones of the surface mount contacts of said circuit component.

14. The circuit of claim 13 wherein the widths of each of the first and second segments of said multi-connection via are selected such that said multi-connection via provides a predetermined impedance characteristic to said circuit component.

15. A multi-connection connector comprising:

a printed circuit board;

a plated through hole provided in said printed circuit board, said plated through hole having at least a first and a second separate electrically isolated segment, each of said at least a first and a second separate electrically isolated segment having a predetermined width;

a first surface mount contact coupled to the first separate electrically isolated segment; and a second surface mount contact connected to the second separate electrically isolated segment.

16. The circuit of claim 15 wherein at least one of the first and a second separate electrically isolated segments is coupled to ground.

17. The circuit of claim 16 wherein at least one of the first and a second separate electrically isolated segments is adapted to couple to a signal trace.

18. A circuit assembly comprising:

(a) a first printed circuit board having at least one ground layer and at least one signal layer and including a plurality of surface mount connectors, each of said surface mount connectors including:

a plurality of multi-connection vias each of said plurality of multi-connection vias provided from a single hole having a plurality of separate electrically isolated segments within the hole, with at least one of said plurality of separate electrically isolated segments coupled to at least one ground layer of said printed circuit board to provide the multi-connection having a ground segment and at least one of said plurality of separate electrically isolated segments coupled to at least one signal layer of said printed circuit board to provide the multi-connection via having a signal segment; and a plurality of pads adapted to accept a surface mount connector, with first ones of said plurality of pads coupled to signal segments of said multi-connection via and second ones of said plurality of pads coupled to ground segments of said multi-connection via; and (b) a second printed circuit board having a connector which includes a plurality of surface mount contacts adapted to mate with the plurality of pads on the first printed circuit board.

19. The circuit assembly of claim 18 wherein each of the second ones of said plurality of pads which are coupled to ground segments of said multi-connection via are coupled together through a single conductor.

20. The circuit assembly of claim 18 wherein each of the plurality of multi-connection vias includes a ground segment to provide a ground conductor connected to a corresponding surface mount ground pad and a pair of signal segments to provide differential signal conductors connected to corresponding surface mount differential signal pads.

21. The circuit assembly of claim 20 wherein each of the ground pads are disposed on a first side of each of the plurality of multi-connection vias and each of the signal pads are disposed on a second side of each of the plurality of multi-connection vias.

22. The circuit assembly of claim 21 wherein the surface mount ground pads for each of the plurality of multi-connection vias are connected together through a conductor.

23. The circuit of claim 21 wherein said first printed circuit board further includes an additional via coupled to a ground pad to provide a ground connection.

* * * * *